United States Patent [19]
Favin et al.

[11] 4,301,536
[45] Nov. 17, 1981

[54] MULTITONE FREQUENCY RESPONSE AND ENVELOPE DELAY DISTORTION TESTS

[75] Inventors: David L. Favin; Peter F. Lynn, both of Little Silver; Paul J. Snyder, Linden, both of N.J.

[73] Assignee: Bell Telephone Laboratories, Incorporated, Murray Hill, N.J.

[21] Appl. No.: 107,787

[22] Filed: Dec. 28, 1979

[51] Int. Cl.³ .............................................. H04B 3/46
[52] U.S. Cl. ..................................... 371/22; 364/481; 324/57 DE
[58] Field of Search ........................ 371/22; 364/481; 324/57 DE

[56] References Cited

U.S. PATENT DOCUMENTS

| | | | |
|---|---|---|---|
| 3,271,666 | 9/1966 | Anderson et al. | 324/57 DE |
| 3,573,611 | 4/1971 | Bergemann et al. | 324/77 R |
| 3,842,247 | 10/1974 | Anderson | 364/481 |
| 3,970,926 | 7/1976 | Rigby et al. | 324/57 DE |
| 4,001,559 | 1/1977 | Osborne et al. | 364/481 |
| 4,039,769 | 8/1977 | Bradley | 324/57 DE |

*Primary Examiner*—David H. Malzahn
*Attorney, Agent, or Firm*—Thomas Stafford

[57] ABSTRACT

Accurate and reliable measurement results are obtained in a test system (FIG. 1) employing digital data acquisition units (121) when measuring frequency response or envelope delay distortion of a network or communication facility (105) by employing a unique test signal (21-tone) including a plurality of tones, each tone having amplitude, frequency, phase component values determined and assigned in accordance with prescribed criteria. The phase component values are determined in accordance with a relationship dependent on the number of tones in the test signal, and in one example, are initially assigned on a random, one-to-one basis to the tones. In a specific embodiment, a test signal is utilized having 21 tones. Further problems arising from nonlinearities on the facility under evaluation (105) are minimized by transmitting the 21-tone test signal a plurality of times and by reassigning the phase component values to the tones each time the test signal is transmitted. In a specific example, the phase component values are reassigned to the tones in counterclockwise, circular fashion after each transmission of the test signal until each tone has taken on each phase component value. Once measurements, i.e., data records, of the transmitted test signal have been obtained, they are utilized to obtain a spectrum, and in turn, the frequency components of the spectrum are employed to obtain the desired measurement of frequency response or envelope delay distortion.

32 Claims, 16 Drawing Figures

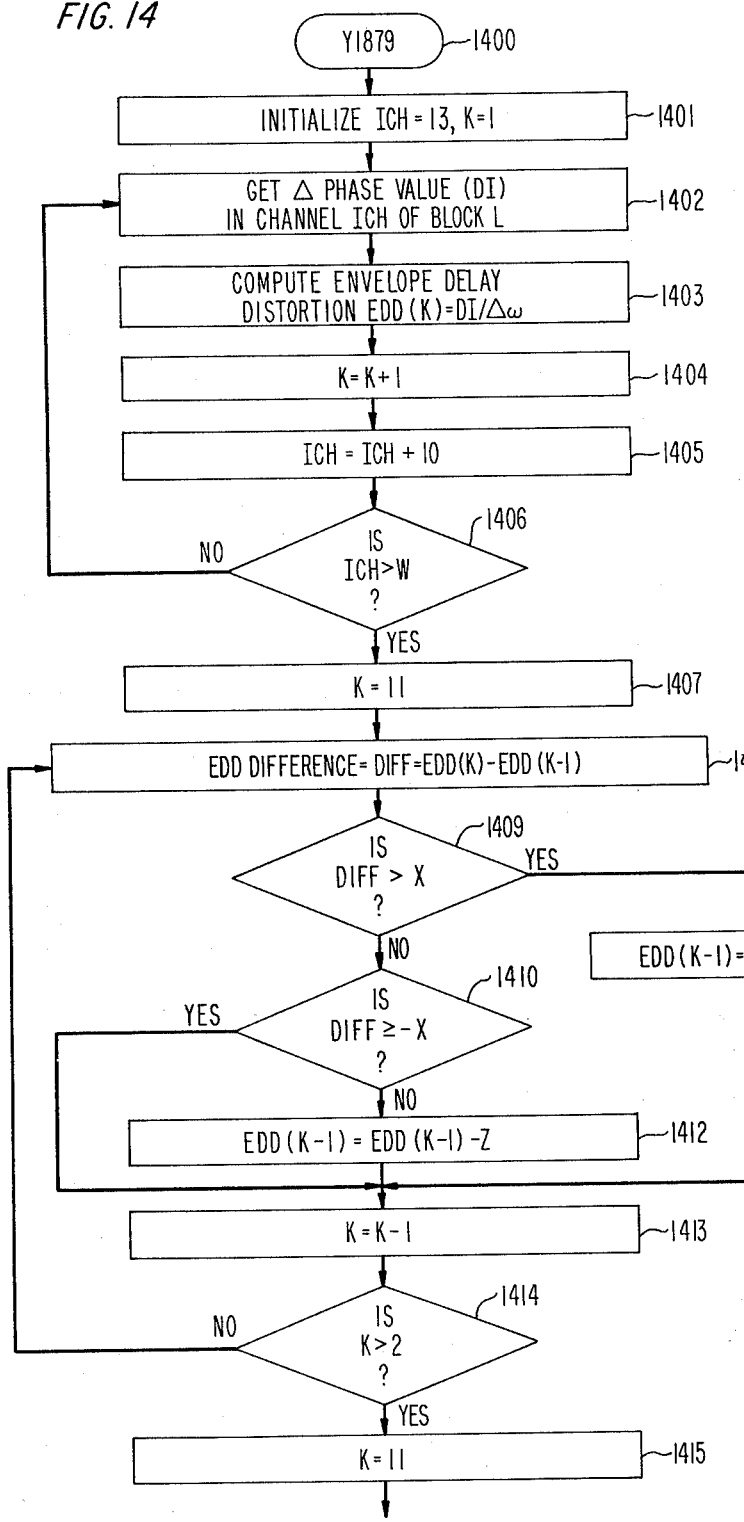

MULTITONE FREQUENCY RESPONSE AND ENVELOPE DELAY DISTORTION TESTS

TECHNICAL FIELD

This invention relates to measurement of transmission parameters and, more particularly, to the measurement of frequency response and envelope delay distortion of networks or facilities.

BACKGROUND OF THE INVENTION

In order to maintain networks or communication systems properly, for example, telephone transmission facilities and the like, numerous measurements are made of network and system characteristics. Important among these are the measurements of frequency response and envelope delay distortion. To this end, what is commonly called envelope delay is measured over the frequency range of the facility being evaluated. Envelope delay is defined as the slope of the phase versus frequency characteristic of the transmission facility. In an ideal communications system, envelope delay is constant over the frequency band. However, in practical systems there are deviations in the envelope delay over the frequency band. These deviations from an arbitrary reference are defined as the envelope delay distortion of the facility.

Heretofore, envelope delay measurements have been made by employing a carrier frequency signal which is amplitude modulated by a stable "low" frequency reference signal. The carrier frequency and upper and lower sidebands are propagated through the facility being evaluated, thereby experiencing a delay dependent upon their position in the frequency band. These signals are detected at the output of the facility under evaluation. Then, a measure of envelope delay at the carrier frequency is obtained by precisely measuring the delay interval between the detected signals and the low frequency reference signal. Thereafter, the carrier frequency is stepped or swept across the frequency band to obtain an overall measure of envelope delay distortion over the frequency band of interest. One such measurement system is disclosed in U.S. Pat. No. 3,271,666 issued to T. C. Anderson and D. L. Favin on Sept. 6, 1966.

More recently, envelope delay measurements have been attempted employing a test signal including a plurality of tones or tone pairs spaced at predetermined frequencies in the frequency band of interest in order to simultaneously obtain a measure of envelope delay over the entire frequency band for the facility under evaluation, as described in U.S. Pat. No. 3,573,611, issued Apr. 6, 1971.

Problems common to the known prior measurement arrangements are errors in and repetition of measurements of envelope delay distortion of facilities on which noise, frequency shift, nonlinearity or other impairments are present. Moreover, it is important to obtain accurate and reliable measurements in the presence of subtle changes in the amount of intermodulation distortion on the facility under evaluation.

Data collected for obtaining envelope delay measurements is also utilized to compute the frequency response of the facility.

SUMMARY OF THE INVENTION

The problems of accuracy, reproducibility and reliability of measurements and other problems of prior measurement apparatus are overcome in measuring frequency response or envelope delay distortion of a network or facility by employing a set of test signals, each test signal having a plurality of tones and each tone having frequency, amplitude and phase component values determined and assigned thereto in accordance with prescribed criteria. An ensemble of measurements is made while transmitting the set of test signals over the network or facility under evaluation. In turn, the ensemble of measurements is used to obtain values for frequency response and/or envelope delay distortion.

In accordance with one aspect of the invention, the set of test signals includes at least one of the test signals having a plurality of tones and the ensemble includes at least one set of consecutively obtained measurements which are averaged.

In accordance with another aspect of the invention, the ensemble includes a plurality of successively obtained sets of measurements. The number of measurements in a set and the number of successively obtained sets of measurements are selected dependent on other characteristics of the network or facility, for example, noise, frequency shift, nonlinearity and the like.

In accordance with still another aspect of the invention, the number of test signals in the set of test signals is also selected dependent on the other characteristics of the network or facility.

In accordance with a further aspect of the invention, phase component values for the test signal tones are determined in accordance with a predetermined relationship dependent on the number of tones in the test signal and then assigned on a one-to-one basis to the tones in a predetermined procedure. In one example, the predetermined selection procedure includes a random selection. The random selection is important so that the test signal has a relatively low crest factor (peak-to-root mean square ratio) similar to a white noise signal.

In accordance with still another aspect of the invention, measurements are made employing a set of test signals including a plurality of test signals each having the plurality of tones and phase component values initially assigned to the tones on a random basis, wherein the phase values assigned to the individual tones are reassigned in accordance with prescribed criteria. In one example, a number of test signals are transmitted and the phase values are reassigned a number of times equal to the number of tones in the individual test signals. That is to say, the phase reassignment is iterated until all the tones have taken on all the phase component values. In a specific example, not intended to limit the scope of the invention, the individual phase component values as reassigned in counterclockwise, circular fashion wherein a specific tone takes on the phase of the next higher frequency tone and the highest frequency tone takes on the phase of the lowest frequency tone. A set of measurements is obtained during transmission of each test signal and time-averaged; thereafter, an ensemble of time-averaged sets of measurements is utilized to obtain the desired measurements of frequency response and envelope delay distortion.

In one measurement procedure employing the set of test signals of the invention, measurements are first obtained to determine values of predetermined characteristics of the facility under evaluation, for example, frequency shift and third order intermodulation distortion. Then, depending on the values of frequency shift and third order intermodulation distortion being within at least first, second or third predetermined limits, at least first, second or third predetermined test procedures, respectively, are employed to obtain the desired measurements of frequency response and/or envelope delay distortion. Specifically, if the frequency shift and third order intermodulation distortion products are within the first limits, a first test procedure is employed utilizing a set of test signals including at least one test signal having the plurality of tones and randomly assigned phase component values wherein a first set of measurements is obtained and time-averaged and a first predetermined ensemble of time-averaged sets of measurements is employed to obtain the desired measurements. If the frequency shift and third order intermodulation distortion values are within second predetermined limits, a second test procedure is employed utilizing a set of test signals identical to the first test procedure wherein a second set of measurements is obtained and time-averaged and a second predetermined ensemble of time-averaged sets of measurements is employed to obtain the desired measurements. If the frequency shift and third order intermodulation distortion values are within third predetermined limits, a third test procedure is employed utilizing a set of signals including a plurality of test signals each including the plurality of tones. Initially, phase values are assigned to the tones on a random basis. After each transmission of a test signal, the phase component values are reassigned to the tones in accordance with a prescribed criterion. In this example, the phase component values are reassigned to the tones on a one-to-one basis in counterclockwise, circular fashion, as described above, until each tone has taken on each phase component value. During individual test signal transmissions, a predetermined set of measurements are obtained and time-averaged. Thereafter, the ensemble of time-averaged sets of measurements is employed to obtain the desired measurements of envelope delay distortion and/or frequency response.

Once the ensemble of time-averaged sets of measurements of the test signals has been made, each time-averaged set in the ensemble is Fourier transformed to the frequency domain and the resulting spectrum is utilized to obtain the desired envelope delay distortion or frequency response measurement in accordance with predetermined procedures.

In one embodiment of the invention, remote test units, each including a data acquisition unit, are employed with a central control unit to effect test measurements. Each data acquisition unit includes arrangements for converting test signals stored in digital form to analog form and for transmitting the analog test signals over a network or communication facility under evaluation to another remote test unit. Additionally, each unit includes arrangements for converting received analog signals to digital form and for transmitting the digital signals to the central control unit for processing. In the central control unit, the received test signal data is Fourier transformed to the frequency domain and the resulting spectrum is used to obtain a measure of envelope delay distortion or frequency response in accordance with prescribed procedures.

BRIEF DESCRIPTION OF THE DRAWING

The invention will be more fully understood from the following detailed description of an illustrative embodiment taken in connection with the appended figures in which:

FIG. 3 illustrates in simplified block diagram form details of a control unit employed in the data acquisition unit shown in FIG. 2;

FIGS. 14 and 15, when connected as shown in FIG. 16, is a flowchart of a program subroutine illustrating a sequence of steps employed in computing values of envelope delay distortion in the routine of FIGS. 11 and 12.

DETAILED DESCRIPTION

Figure 1:
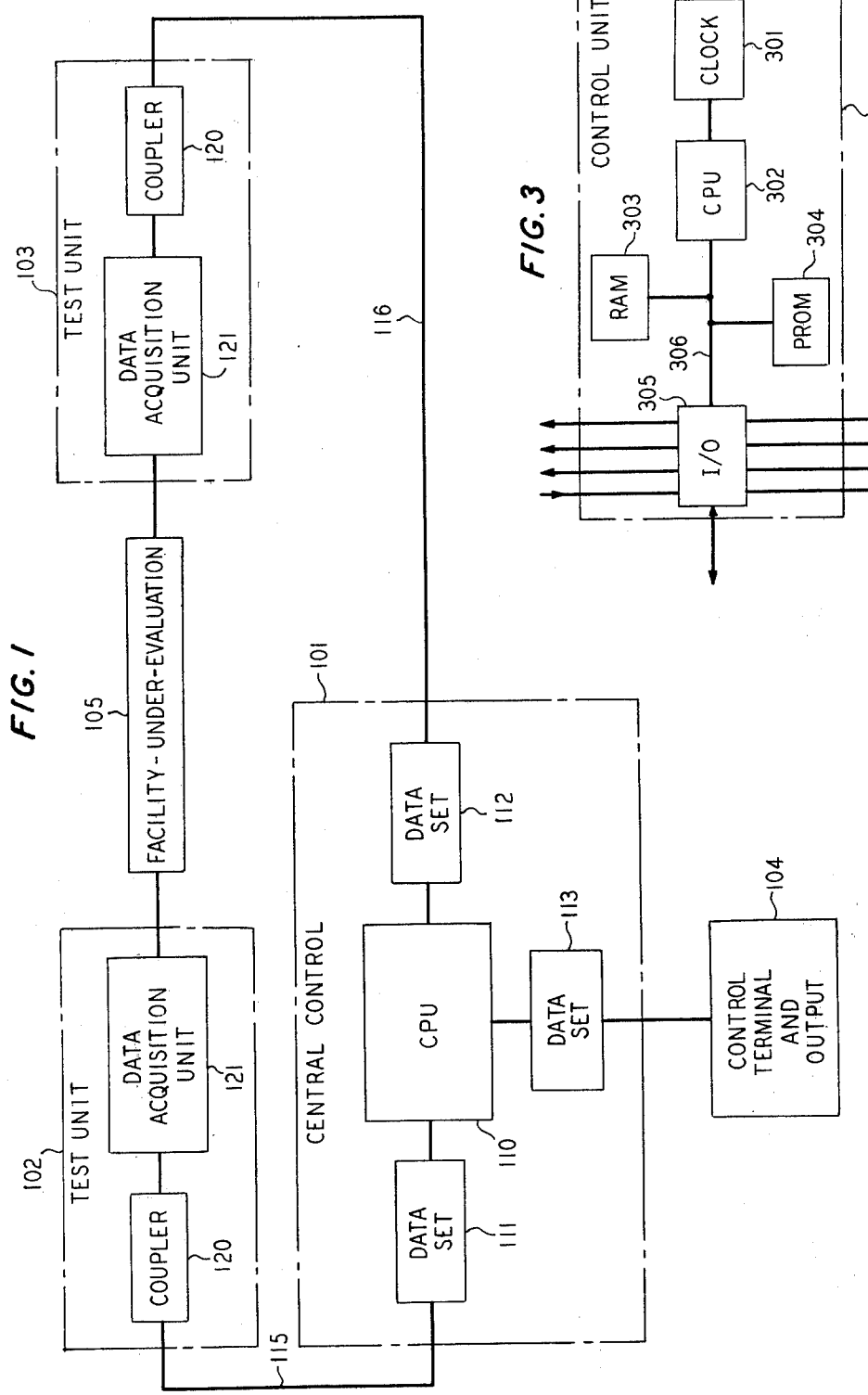
FIG. 1 shows in simplified block diagram form an arrangement including an embodiment of the invention for obtaining measurements in accordance with an aspect of the invention.

FIG. 1 shows in simplified block diagram form a system arrangement which is advantageously utilized to make frequency response and/or envelope delay distortion measurements in accordance with one embodiment of the invention. Accordingly, shown is central control 101, first remote test unit 102, second remote test unit 103, control terminal and output unit 104 and facility under evaluation 105. Test units 102 and 103 are adapted for being connected to facility under evaluation 105 and to central control 101. Facility 105 may be a communications link, for example, a voice frequency telephone line, or the like.

Central control 101 includes, in this embodiment, computer 110, data set 111 for transmitting and receiving information in digital form to and from, respectively, test unit 102, data set 112 for transmitting and receiving information in digital form to and from, respectively, test unit 103 and data set 113 for transmitting and receiving information in digital form to and from, respectively, control terminal 104.

Computer 110 may be any of the general purpose computers known in the art and includes associated core and disc memory units. Preferably, computer 110 includes a 2100S series Hewlett-Packard (H-P) computer which contains in memory a 5451B Fourier Analyzer Software System commercially available from Hewlett-Packard. Operation of the 2100 series Hewlett-Packard Computer is described in Hewlett-Packard Computer Reference Manual No. 02100-90001 dated Dec. 1, 1971, and also in H-P Installation and Maintenance Manual No. 02100-90002 dated April 1973. The disc memory unit, which in this example is an H-P 7900A (not shown), is described in the H-P Disc 7900A Disc Drive Operating and Service Manual No. 07900-9002. Similarly, the 5451B software is described in Fourier Analyzer System 5451B Manual No. 05451-90199 dated August 1974, with Supplements No. 05451-90268 dated March 1975 and No. 05451-90411 dated May 1976. For subroutines available in the 5451B system and their use, also see "Hewlett-Packard Fourier Analyzer Training Manual - Application Note 140-0" and the "Fourier Analyzer 5451B Keyboard Command Manual," dated October 1973.

Data sets 111 and 112 are identical. In this example, they are 202C type data sets which transmit and receive at 1200 baud and are commercially available from Western Electric Company. Similarly, data set 113 is, in this example, a 103 type data set which transmits and receives at 300 baud and also is commercially available from Western Electric.

Control terminal and output unit 104, in this example, is a Texas Instruments Model 745 Terminal. The individual program routines in the 5451B Fourier Analyzer Software System are initiated by commands entered on terminal 104 keyboard as described in the above noted "Keyboard Command Manual," or, alternatively, by programs stored on the disc memory and retrieved under control of an operating system program.

Thus, as shown, central control 101 is adapted to be connected via communications facilities 115 and 116 to test units 102 and 103, respectively. Facilities 115 and 116 may be, for example, Direct Distance Dialing (DDD) communications facilities.

Test units 102 and 103 are identical, both including coupler 120 and data acquisition unit 121. Coupler 120 is an acoustically coupled modem, for example, an Anderson-Jacobson Model ADC 1200 and is employed to acoustically couple test units 102 and 103 via DDD facilities 115 and 116 to central control 101.

Details of one system which may be employed for the arrangement shown in FIG. 1, are disclosed in U.S. Pat. No. 4,001,559 issued Jan. 4, 1977.

At the outset, it should be noted that it is contemplated and anticipated that in other applications, and/or embodiments of the invention, the functions of central control 101 be included in remote test units 102 and 103, thereby eliminating the need for central control 101. In such an arrangement the intelligence of central control 101 would have to be included in the remote test units via additional processing and memory capability. Additionally, other embodiments of the invention may include hardware signal generators and receivers.

Figure 2:
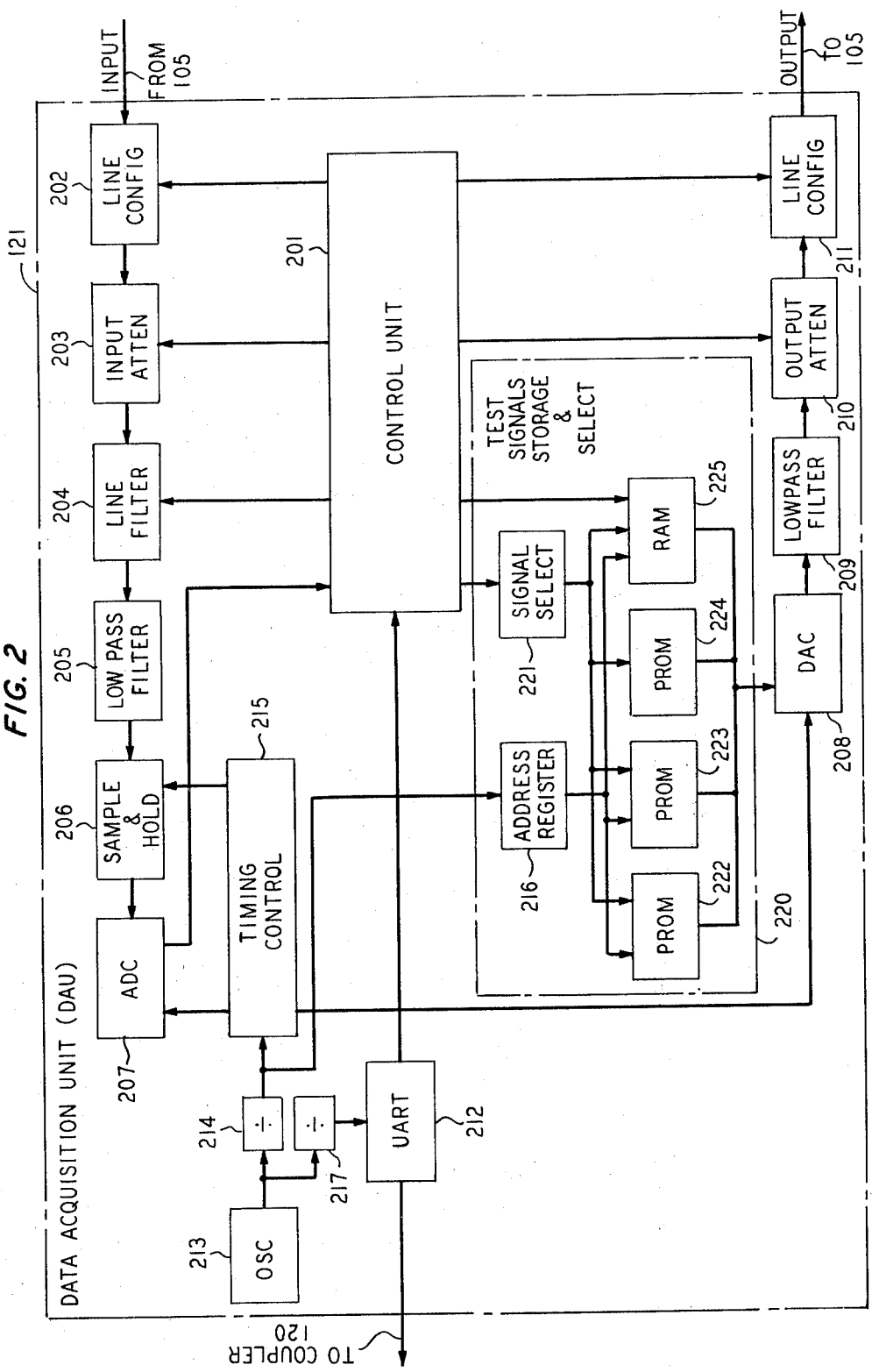
FIG. 2 depicts in simplified block diagram form details of a data acquisition unit employed in the test units of FIG. 1.

FIG. 2 shows in simplified block diagram form details of data acquisition unit (DAU) 121. Accordingly, shown is control unit 201, which is a microcomputer system as shown in FIG. 3 and described below. Control unit 201 is employed to control the configuration and operation of DAU 121 for transmitting and receiving information to and from, respectively, facility under evaluation 105 and central control 101.

DAU 121 has an input adapted to be connected to network or facility under evaluation 105 and an output also adapted to be connected to facility 105, both under control of control unit 201 in response to commands from central control 101.

An input or receive section of DAU 121 includes line configuration unit 202, input attenuator 203, line filter 204, low pass filter 205, sample and hold 206 and analog-to-digital converter (ADC) 207.

Similarly, an output or transmit section of DAU 121 includes digital-to-analog converter (DAC) 208, low pass filter 209, output attenuator 210 and line configuration unit 211.

Signals are supplied from and to unit 121 via universal asynchronous receiver transmitter (UART) 212 and coupler 120 to and from, respectively, central control 101. In this example, a Western Digital 1602R UART is employed.

Oscillator 213 in conjunction with divider 214 generates a first timing signal which is supplied to timing control 215 and address register 216. In this example, the first timing signal is the digital sampling rate and is 8 kHz. Similarly, oscillator 213 in conjunction with divider 217 generates a second timing signal for driving UART 212, in this example, 19.1 kHz.

Timing control 215 includes a plurality of timing circuits (not shown), for example, monostable circuits connected in tandem to generate a desired sequence of pulse signals for controlling sample and hold 206, ADC 207 and DAC 208. In this example, an incoming analog test signal is sampled prior to being converted to digital form.

Line configuration units 202 and 211 are identical and are employed under control of unit 201 to select input and output impedance values, respectively, in this example, either 600 ohms or 900 ohms.

Input attenuator 203 includes a plurality of programmable attenuators (not shown) capable of inserting under control of unit 201 attenuation in prescribed steps into the input channel of DAU 121. In an example from experimental practice, 3 dB attenuation steps are employed. Specifically, a plurality of high gain amplifiers, commonly referred to as operational amplifiers, having controllable gain responsive to digital signals from control unit 201, are employed for this purpose in well-known fashion.

Output attenuator 210 is essentially identical to input attenuator 203, except that the attenuation adjustment in this example is in 1 dB steps.

Line filter 204 is selected under control of control unit 201, depending on the specific type of test being run; in this example, filter 204 is of a type having a flat amplitude versus frequency characteristic over the voice frequency band, e.g., from DC through 3600 Hz. The filter selection is realizable in well-known fashion, for example, by enabling the input of an active filter having the desired amplitude versus frequency characteristic.

Low pass filters 205 and 209 are identical and are active resistor-capacitor active filters forming an 8 pole, low pass filter configuration. Such a filter is realizable by employing four so-called biquad active filters in tandem. A typical biquad active filter circuit is described in U.S. Pat. No. 3,919,658 issued to J. J. Friend on Nov. 11, 1975.

Sample and hold 206 is employed to controllably sample, i.e., to obtain a measurement of a received analog signal. In an example from experimental practice, a Burr-Brown SAM 60 sample and hold unit is employed for this purpose.

The sampled signal held in sample and hold 206 is converted into digital form via ADC 207. In this example, the analog signal sample is converted into a 12 bit digital signal by employing a Burr-Brown ADC 85-12.

As indicated above, timing control 215 generates signals at the 8 kHz rate for operating sample and hold 206 prior to the digital conversion in ADC 207.

DAC 208 is a 12 bit digital-to-analog converter for converting 12-bit digital signals from test signal storage and select circuit 220 into an analog test signal. In this example, a zero-order hold Burr-Brown DAC 85-CBI-V is employed for this purpose.

Test signal storage and select circuit 220 includes address register 216, signal select circuit 221, programmable read-only memories (PROMs) 222, 223 and 224 and read-write memory, commonly referred to as RAM 225. It is anticipated that in commercial use the PROMs will be replaced by ROMs and that additional memory units may be employed, depending on the type and number of test signals to be generated. Although shown as single units, each of PROMs 222 through 224 includes two 8-bit PROM units, each used to store 6-bit words, thereby forming 12-bit memory units. Similarly, RAM 225 is also a 12-bit storage arrangement. RAM 225 is intended for use in storing any test signal to be supplied from central control 101 (FIG. 1).

Address register 216, in response to the second timing signal from divider 214 (8 kHz), continuously generates a sequence of addresses corresponding to the addresses of buffer stages in PROMs 222, 223 and 224 and RAM 225 in well-known fashion. Thus, the buffer stages of a selected PROM or RAM memory unit are continuously sequenced through.

Signal select unit 221 includes a binary coded decimal to decimal decoder unit (not shown) which, under control of control unit 201, selects a particular one of PROMs 222, 223 or 224 or RAM 225 to be employed for generating a specific test signal. Digital outputs from PROMs 222, 223 and 224 and RAM 225 are supplied to DAC 208 for conversion into an analog test signal.

In this example, PROMs 222 and 223 are employed to store digital representations of test signals intended to be employed for obtaining a measure of intermodulation distortion of facility 105 as described in our copending application Ser. No. 107,788, filing date Dec. 28, 1979. To this end, PROM 222 stores digital representations of signal amplitudes for generating, in conjunction with DAC 208 and low pass filter 209, an analog single frequency test signal. This single frequency signal is employed in this embodiment of the invention, as will be discussed below, to obtain a measure of frequency shift. Additionally, the single frequency signal is used to measure noise which is applied to the intermodulation distortion measurement in a compensating manner. In an example from experimental practice, a test frequency of 1015.625 Hz corresponding to channel 65 is employed for this purpose. Hereinafter, this signal shall be referred to as 1016 Hz. In the instant example, frequency separation between channels is 15.625 Hz. The usual 1,000 Hz test tone widely employed in telephone systems cannot be utilized for the noise and frequency shift tests because it is a subharmonic of the T-carrier sampling rate.

PROM 223 stores digital representations of signal amplitudes for generating, in conjunction with DAC 208 and low pass filter 209, a test signal having three tones used in obtaining a measure of intermodulation distortion. However, the measure of intermodulation distortion may be obtained by employing other known apparatus, for example, the arrangement disclosed in U.S. Pat. No. 3,862,380.

Applicants' unique set of test signals includes at least one test signal having a plurality of predetermined tones, each having a predetermined amplitude, frequency and phase determined, in accordance with an aspect of the invention, by prescribed criteria to minimize the effect of distortion and nonlinearities on the actual frequency response and envelope delay distortion measurements. The number of tones, the individual tone frequencies and the corresponding phase values have been selected to realize a desired precision and reliability in the measurements in the presence of noise, frequency shift and nonlinearity on the network or facility under evaluation. Specifically, the number of tones used depends on signal to noise ratio, frequency response resolution, difference in frequency between adjacent tones for an envelope delay distortion definition (ripple characteristic), tone frequencies and tone frequency spacing under frequency shift conditions.

In an example from experimental practice, a test signal having $N=21$ tones is employed. However, in other applications a larger or smaller number of tones may equally be employed. Moreover, phase component values to be assigned to the tones can be selected from any desired probability density function. In this example, individual phase values ($\phi$) are determined by $\phi n = (360/N) \cdot (n)$, where, in this example, $N=21$ and n is the number of the individual tone, namely, 1 through 21. Although phase values may be assigned in any consistent manner, it is preferred that the individual phase values $\phi n$ are initially assigned to the individual tones on a one-to-one basis, in accordance with a prescribed criterion, wherein a random selection procedure is utilized. This is important so that the test signal has a relatively low crest factor (peak-to-root mean-square ratio) similar to a white noise signal. In an example from experimental practice not intended to limit the scope of the invention, the tone frequencies are from 203.125 Hz to 3328.125 Hz at a spacing of 156.25 Hz. Thus, $T1=203.125$ Hz, $T2=359.375$ Hz, and so on, to $T21=3328.125$ Hz. Applicants, by advantageously selecting the tone frequencies, are able to use a single set of test signals to measure both frequency response and envelope delay distortion. Additionally, the choice of employing 21 tones, as compared to 20 pairs of tones, results in significantly better signal to noise ratio and, therefore, fewer data records are required to generate accurate measurement results in the presence of noise on network or facility 105. Moreover, applicants have selected the frequencies so that the test results are immune from T-carrier sample interferences and also from interferences caused by second order intermodulation distortion on facility 105. This results because all second order intermodulation distortion products are at frequencies at least 3 channels away from the frequencies of the 21 tones.

It should be recognized, assuming the above signal to noise ratio conditions, that when the test signal experiences frequency shift on the network or facility under evaluation, the received test signal is no longer periodic with respect to the sampling interval. This lack of periodicity when taking a long term average would yield a zero result. Thus, a number of data records in a set that can be time-averaged in the presence of frequency shift is limited by the measurement accuracy desired. However, it is desirable to take a large number of data records to reduce variance in the test results caused by noise in the test signal. As indicated above, the number of data records in a set is limited by frequency shift. A trade-off exists in the presence of frequency shift in the number of data records time-averaged per set. Consequently, the number of successively obtained sets in an ensemble is adjusted in a manner corresponding to the adjustment in the number of measurements in a set to minimize the effect of the noise. Ideally, the total number of data records taken in an ensemble should be constant; however, deviation from the ideal occurs in practical systems.

Applicants employ one of a plurality of test procedures to obtain measurements of frequency response and/or envelope delay distortion, depending on the amount of frequency shift (FS) and third order intermodulation distortion products on facility 105, as follows:

| Test | Frequency Shift (FS) | Third Order Intermodulation Distortion (3OID) |
|---|---|---|
| 1 | $|FS| \leq 0.15$ Hz | $3OID \leq -46$dB |
| 2 | $|FS| \leq 1.0$ Hz | $3OID \leq -46$dB |
| 3 | $|FS| \leq 1.0$ Hz | $3OID \leq -28$dB |

Tests 1 and 2 utilize a set of test signals, in this example, including at least a single test signal having 21 equal amplitude tones at frequencies as indicated above and having phases selected in accordance with the above-prescribed random assignment criterion. The set of test signals employed in Tests 1 and 2 are identical and stored in PROM 224 for use as desired. Alternatively, the set of signals for Tests 1 and 2 is supplied from central control 101 and stored in RAM 225 for later use. When making a test, the set of test signals is continuously generated by test unit 102 and supplied to network or facility 105.

Because of low frequency shift and third order intermodulation distortion, Test 1 can be advantageously employed. In Test 1, a set of 16 data records (measurements) of the incoming Test 1 signal is taken and time-averaged in test unit 103 and an ensemble of only 6 successive, time-averaged sets of data records (measurements) are transmitted to central control 101. Accuracy of the results is maintained even in the presence of signal to noise ratios as low as 24 dB. Use of this unique procedure results in considerable time savings because time averaging of data records in test unit 103 is on the order of milliseconds per data record while transmission of a time-averaged set of data records to central control 101 is on the order of seconds per time-averaged set. Thus, it is more advantageous to take more data records to be time-averaged in a set and transmit fewer time-averaged sets of data records.

Because of higher frequency shift and low third order intermodulation distortion, Test 2 can advantageously be employed. In Test 2, a set of only three data records of the incoming Test 2 signal is taken and time-averaged while an ensemble of 21 time-averaged sets of data records is transmitted to central control 101 for processing. This increases the processing time significantly over Test 1; however, the ensemble of 21 time-averaged sets of data records are needed in order to maintain the desired accuracy in the test results when greater frequency shift is present on facility 105.

In Test 3 a set of test signals having a predetermined number of test signals is advantageously utilized to obtain desired accuracy in the presence of high frequency shift and high third order intermodulation distortion. The set of test signals includes signals having 21 equal amplitude tones at frequencies as described above. The phase values are assigned to the initial one of the test signals in the set on a random basis. Once phases are assigned, the test signal is completely deterministic, i.e., it can be processed with this known information at the receiver. After transmission of each test signal in the set, the phase values are reassigned in accordance with an aspect of the invention by employing a prescribed criterion to effectively average out any third order intermodulation distortion products that are at any of the tone frequencies. Although any reassignment procedure may be employed so long as each tone is assigned each phase value, it is preferred that the phase values are rotated in a predetermined order after the initial random assignment. In one example, the phases are rotated so that a given tone is assigned the phase of the next higher tone and the highest tone (21) takes the phase of the lowest frequency tone (1) until the phase of each tone is changed 21 times. That is to say, the phase values are rotated in counterclockwise, circular fashion after each transmission of the test signal until each tone has taken on all the phase values, i.e., until 21 different test signals have been transmitted. In this example, each of the 21 test signals in the set of test signals for Test 3 is transmitted from central control 101 to test unit 102 and stored in RAM 225 for use in generating the desired test signal for transmission over network of facility 105.

In Test 3 a set of three data records is taken for each incoming test signal and time-averaged. Thus, an ensemble of 21 successive time-averaged sets of data records is transmitted to central control 101 for processing.

It is anticipated that in apparatus in which a central control unit is not employed, the set of 21 test signals for Test 3 may be stored in a ROM and used as desired. Indeed, any or all of the test signals may be stored either as time signals or as their equivalent frequency domain values which are transformed to the time domain when required. It should be noted that the set of 21 test signals employed in Test 3 may equally be employed to obtain measurements under conditions in which Tests 1 and 2 are made. However, the signals employed in Test 3 are advantageously employed to obtain so-called worst case envelope delay distortion and frequency response measurements. In an example from experimental practice, envelope delay distortion measurement are made within an accuracy of 10 microseconds and frequency response within an accuracy of 0.1 dB, in the presence of third order intermodulation distortion as high as 28 dB. As indicated above, the 21-tone spectrum has been selected to be immune to second order intermodulation distortion products.

Digital representations of the single tone test signal, the three tone test signal and a 21 tone test signal are generated in well-known fashion for storage in PROM 222, PROM 223 and PROM 224, respectively. Similarly, digital representations of the 21-tone signals to be transmitted to RAM 225 are also generated in well-known fashion. In this example, the digital signal representations stored in PROM and/or RAM memory are optimized for the specific unit employed for DAC 208, in this exxample, a Burr Brown DAC 85-CBI-V. An 8 kHz sampling rate and 512 twelve bit samples per "record" are employed. This allows for generation of time signals containing one or more frequencies in the 15.625 Hz to 4 kHz in 15.625 Hz increments. Twelve bit samples are generated which are separated into two parts, namely 6 least significant bits and 6 most significant bits. Each test signal is normalized to a reference signal containing a single tone to maximize output power from DAC 208 and at the same time differs from the reference signal power by integer dB values. Output attenuator 210 then corrects for the different power levels and provides for transmitting specified power levels in the integer steps, for example, of 1 dB.

Digital representations corresponding to signal amplitude samples to be stored are readily obtained knowing: (1) the number of tones (1 to 256) in the signal; (2) the channel number of the reference frequency; and (3) the peak amplitude (volts), frequency channel, and phase (degrees) for each tone. In this example, a channel number of a tone (1 to 256) is equal to the frequency in hertz divided by the frequency resolution (15.625 Hz).

Maximum output power for a signal that contains only the reference frequency is obtained, taking into account the aperture distortion of zero-order hold DAC 208, according to the equation;

$$F_0(\omega) = \frac{\sin(\pi\omega/\omega_S)}{\pi\omega/\omega_S} F_i(\omega)\exp^{-j\omega T/2} \quad (1)$$

where
 $T = \frac{1}{8}$ kHz $= 125$ $\mu$s sampling interval,
 $\omega =$ radian frequency,
 $\omega_S =$ radian sampling frequency,
 $F_i(\omega) =$ DAC input level, and
 $F_0(\omega) =$ DAC output level.

The value 4.99756 is the maximum voltage that DAC 208 can accommodate without overloading. It is an approximation of the voltage $V_{FS} - 1$ LSB, where $V_{FS}$ is the full scale voltage of the DAC (5 volts) and 1 LSB is the quantization step size, $2 V_{FS}/4096$.

Amplitudes of the tones are now adjusted so that the total adjusted output power of DAC 208 is equal to the output power from a signal that contains only the reference frequency.

Amplitude and phase values of the individual tones are pre-equalized to compensate for the aperture distortion, i.e., amplitude and phase versus frequency characteristic, of DAC 208 according to Equation (1) above.

The test signal is now sampled according to the equation:

$$Y(n) = \sum_{K=1}^{N} A(K)\cos[\omega(K)nT + \phi(K)], \quad (2)$$

$n = 0, 1, ..., 511$ where
 $\phi =$ phase,
 $N =$ number of tones in signal, and
 $T = \frac{1}{8}$ kHz $= 125$ $\mu$s sampling interval.

Each sampled value is checked to make sure it does not exceed the maximum level allowed by DAC 208 ($\pm 4.99756$). If it does, the power of the signal is reduced by 1 dB, the new tone amplitudes are computed, and the signal is resampled. The above process is repeated until all of the sampled values are within DAC 208 power requirements.

Each sampled value is quantized for 12 bit complementary offset binary code according to the function:

$$X(n) = (N/2 - 1) - [N/2\{Y(n)/V_{FS}\}] \quad (3)$$

where
 $V_{FS} =$ DAC full-scale output voltage,
 1 LSB $= 2_{FS}/N =$ quantization step size,
 $N = 2^b =$ number of quantizing steps,
 $b =$ converter resolution,
 $X(n) =$ quantized amplitude sample, and
 $Y(n) =$ signal sampled amplitude.

For a 12 bit converter with a full-scale voltage of 5 volts, Equation (3) reduces to:

$$X(n) = 2047 - 409.6\ Y(n) \quad (4)$$

The quantized values are then rounded off to the nearest 4-digit integer and converted to a 4-digit octal word which is then separated into two parts, one part representing the 6 least significant bits (LSB) and the other part representing the 6 most significant bits (MSB) of each 12 bit word. The resultant 12 bit words are stored in buffers of a corresponding one of PROMS 222-224 or RAM 225 for use later in generating desired test signals.

It should be noted, however, that additional pre-equalization of amplitude and phase components of the test signal can be performed to account for an expected transmission characteristic. This is done to provide an equivalent signal-to-noise ratio for all signal components at the receiver. Additionally, the form of the measurement result is easier to comprehend since only deviations from the expected measurement are displayed.

FIG. 3 shows in simplified block diagram form details of control unit 201. Accordingly, shown are clock 301, central processing unit (CPU) 302, read-write memory, commonly called RAM 303, programmable read only memory (PROM) 304, and input/output (I/O) 305. Clock 301 generates timing signals for CPU 302 in well-known fashion. CPU 302, RAM 303, PROM 304 and I/O 305 are interconnected via bus 306 to form a microcomputer system. CPU 302 may be any of numerous computer arrangements known in the art. In this example, an Intel 8080A unit is utilized with associated compatible circuit elements. The 8080A, its operation and programming are described in "Intel 8080 Microcomputer Systems Users Manual," dated Sept. 1975. It should be noted that microcomputer arrangements, including the desired configuration of control unit 201, are available as a single unit, for example, the Intel 8741.

A program is stored in PROM 304 of control unit 201 for controlling operation of data acquisition unit 121 and, hence, test units 102 or 103 in response to commands from central control 101. Thus, control unit 201 accepts commands supplied from centrol 101 via coupler 120 and UART 212, decodes and executes the commands. A list of preferable commands are set out below. The specific procedure for decoding and executing the commands will be apparent to those skilled in the art.

Briefly, when either test unit 102 or 103 is functioning as a receiver, control unit 201, in response to appropriate commands, connects the input port of DAU 121 to facility 105, sets line configuration 202 to a proper impedance or termination, adjusts input attenuator 203 to a desired or specific value, sets line filter 204 to a specific filter configuration and stores in RAM 203 (FIG. 3) 512 twelve-bit digital representations designated a record of a received test signal. The running average of Y data records is stored in RAM 303, the number Y being dependent on the test being performed. The individual records are thereafter transmitted to central control 101 via UART 212 and coupler 120 (FIG. 1) for use in obtaining a test result in a manner to be described below. Similarly, when either test unit 102 or 103 is used as a transmitter, control unit 201, in response to appropriate commands from central control 101 connects the output port of DAU 121 to facility 105, sets line configuration 211 to a desired impedance or termination, adjusts output attenuator 210 to a desired value and causes 512 twelve-bit test signal samples to be supplied in sequence from test signal storage and select circuit 220 to DAC 208 for generating a corresponding analog test signal. Depending on the particular test being performed, each test unit can be operating as either a receiver or a transmitter.

A list of typical commands for test units 102 and 103, including the characters, are shown below. An "x" adjacent to the command indicates type of command, immediate or string; and number of characters, i.e., 1 or 2. In this example, the commands are in ASCII code. specifically, 6 bit stripped ASCII is employed and, then, only those characters included in the so-called "dense" ASCII set.

Attention ($\phi$) is a 1-character command that causes test unit 102 or 103 to generate audio and visual signals informing an operator to contact central control 101.

Self Test (1) is a 1-character command that initiates a sequence of self-test procedures for test unit 102 or 103 and transmits the self-test status to central control 101.

Send Samples (2) is a 1-character command that instructs test unit 102 or 103 to transmit data samples (records) from RAM 303 to central control 101.

Stop Generator (3) is a 1-character command that instructs test unit 102 or 103 to disable its transmitter.

Retransmit Status (4) is a 1-character command that instructs test unit 102 or 103 to transmit the current data status information to central control 101. It provides for resending the "data status" response for the case where it is received with errors or is not received at all. This could prevent the need for resending all of the data samples, which is time-consuming.

End I/O (5) is a 1-character command that terminates all communication with test unit 102 or 103. Communication is re-established when test unit 102 or 103 receives a valid "start I/O" command.

Load Transmit Buffer (6+From Where) is a 2-character command. The first character is a 6; the second character instructs test unit 102 or 103 to load data into the transmit buffer, i.e., RAM 225, from modem 120 (binary $\phi$) or from RAM 303 (binary 1).

Start String (7+String Number) is a 2-character command that instructs test unit 102 or 103 that, following this command, a series of commands will be sent that are to be stored in RAM 303. The second character of the command represents the string identification, A

| COMMAND | TYPE COMMAND IMMEDIATE | TYPE COMMAND STRING | CHARACTERS IN COMMAND 1 | CHARACTERS IN COMMAND 2 | CHARACTERS 1st | CHARACTERS 2nd |
|---|---|---|---|---|---|---|
| ATTENTION | x | | x | | $\phi$ | |
| SELF TEST | x | | x | | 1 | |
| SEND SAMPLES | x | | x | | 2 | |
| STOP GENERATOR | x | | x | | 3 | |
| RETRANSMIT STATUS | x | | x | | 4 | |
| END I/O | x | | x | | 5 | |
| LOAD TRANSMIT BUFFER | x | | | x | 6 | BINARY $\phi$ Binary 1 |
| START STRING | x | | | x | 7 | Binary 1 thru 10 |
| STRING ENABLE | x | | | x | 8 | Binary $\phi$ thru 9 |
| START I/O | x | | | x | Ⓐ | Binary $\phi$ thru 9 |
| ADC RANGE | | x | x | | A | |
| DELAY | | x | | x | D | Binary 1 thru 63 |
| END STRING | | x | x | | E | |
| FILTER | | x | | x | F | Binary $\phi$ or 1 |
| GENERATE | | x | | x | G | Binary $\phi$ thru 63 |
| INPUT ATTN | | x | | x | I | Binary $\phi$ thru 15 |
| LINE CONFIGURATION | | x | | x | L | 6-Bit Byte |
| OUTPUT ATTN | | x | | x | O | Binary $\phi$ thru 5$\phi$ |
| SAMPLE | | x | | x | S | Binary 1 thru 16 |
| WAVEFORM SELECT | | x | | x | W | Binary $\phi$ Binary 1 Binary 2 |

A detailed description of the immediate commands follows through E, using binary 1 through binary 5, respectively.

String Enable (8+String Number) is a 2-character command that instructs test unit 102 or 103 to execute the string program represented by the second character of the command. Program A through E correspond to binary 1 through binary 5, respectively.

Start I/O (Control A+Address) is a 2-character command that informs test unit 102 or 103, having an address given in the second character of the command, to expect more commands from central control 101. The second character of the command can be a binary number from zero to nine. This number corresponds to the decimal number selected by a rotary switch on the front panel of test unit 102 or 103. When a valid "start I/O" command is received, test unit 102 or 103 performs initialization procedures that prepare test unit 102 or 103 to accept data or commands from central control 101. The "start I/O" command cannot interrupt the operation of a string program or the loading of data. Central control 101 must wait until these operations are complete before sending this command. The signal generator is disabled if it happens to be generating when the "start I/O" command is received by test unit 102 or 103.

A detailed description of string commands follows.

ADC Range (A) is a 1-character command that instructs test unit 102 or 103 to auto-range its input attenuators for an optimum signal level for analog-to-digital conversion.

Delay (D+N Records) is a 2-character command that instructs test unit 102 or 103 to generate a time delay equal to the integer number N record lengths. The value of N can range from 1 to 63 and is coded in a 6-bit byte having binary values from 1 to 63, respectively.

End String (E) is a 1-character command that is recognized by test unit 102 or 103 as the string sequence terminator.

Filter-Select (F+Which One) is a 2-character command that instructs test unit 102 or 103 to select one of two line filters. Line filter 204 is coded in the 6-bit byte of the second character. Filter 204 in this example has a loss equal to the flat loss of filter 205 and is selected by the second character being binary $\phi$.

Generate (G+N Times) is a 2-character command that instructs the transmitter to generate N repetitions (records), of the waveform selected, with DAC 208 and then stop. If N is zero, the transmitter will continue to generate until told to stop by the "stop generator" command. The value of N can range from 0 to 63 and is coded in a 6-bit byte, having binary values from 0 to 63, respectively. When the "generate" command is being executed as part of a string program, the number of repetitions N are externally controlled from control 201 of test unit 102 or 103 so that control 201 is free to do other chores. The "start I/O" command, as well as the "stop generator" command, will stop the generator.

Input Attenuator (I+Attenuation) is a 2-character command that instructs test unit 102 or 103 to set input attenuator 203 to a fixed value, in 3 dB increments. The second character of the command specifies the inputs attenuator settings with a 6-bit byte. Input attenuator settings corresponding to values from 0 dB to 45 dB, in 3 dB increments, are represented with binary values from 0 to 15, respectively.

Line Configuration (L+Type Configuration) is a 2-character command that instructs test unit 102 or 103 to set its terminal conditions in accordance with the bit values of a 6-bit byte of the second character. The bit values and functions are as shown below. Reference to transmit or receive terminals means those terminals that are normally used for transmitting or receiving.

| Bit Position | Bit Value | Function |
| --- | --- | --- |
| 1 | $\phi$ | Normal. |
|   | 1 | Connect Transmitter to Receive Terminals and Receiver to Transmit Terminals. |
| 2 | $\phi$ | Provide 600 ohm Transmit and Receive Impedance. |
|   | 1 | Provide 900 ohm Transmit & Receive Impedance. |
| 3 | $\phi$ | Normal. |
|   | 1 | Loop Line - Connect Transmit Line to Receive Line (through input amplifier and output attenuator). |
| 4 | $\phi$ | Normal. |
|   | 1 | Loop Set - Connect Transmitter Output to Receiver Input. |
| 5 | $\phi$ | Normal. |
|   | 1 | Connect Receiver Input for Noise to Ground Measurements. |
| 6 | $\phi$ | Provide for Terminating Impedance at Receiver Input. |
|   | 1 | Provide for DC Measurements at Receiver Input. |

Output Attenuator (O+Attenuation) is a 2-character command that instructs the transmitter to set output attenuator 210. Output attenuator 210 has a range from 0 to 50 dB, in 1 dB steps. The second character of the output attenuator command specifies the output attenuation with a 6-bit byte. Output attenuation values from 0 to 50 dB are represented by consecutive binary values from 0 to 50, respectively.

Sample (S+Y Records) is a 2-character command that instructs test unit 102 or 103 to sample Y successive records, i.e., take amplitude measurements of the received signal. Corresponding sampled values in each record are added together algebraically and averaged. The value of Y can be any number from 1 to 16 and is coded in a 6-bit byte having binary values from 1 to 16, respectively. Each sampled value is checked for an overload condition during sampling.

Waveform Select (W+Which Waveform) is a 2-character command tht instructs test unit 102 or 103 to select one of four different waveforms according to the value of the second character which represents a 6-bit byte having a value of binary $\phi$, 1, 2 or 3, namely, signal in RAM 225, 1016 Hz, 3-tone or 21-tone, respectively.

| Binary Value | Waveform |
| --- | --- |
| $\phi$ | Signal in RAM 225. |
| 1 | 1016 Hz PROM 222. |
| 2 | 3-Tone PROM 223. |
| 3 | 21-Tone PROM 224. |

Several modes of testing are possible at and between test units 102 and 103, namely, straightaway measurements from one test unit to the other, loop test unit measurements where the transmit and receiver circuits of a unit are interconnected through a circuit (not shown) in DAU121, loopback measurements where the transmit port and receive port of a single test unit are connected through an external network and loop line measurements where, for example, a 4-wire facility is looped at the far end by a circuit (not shown) in the far end test unit.

Figure 4:
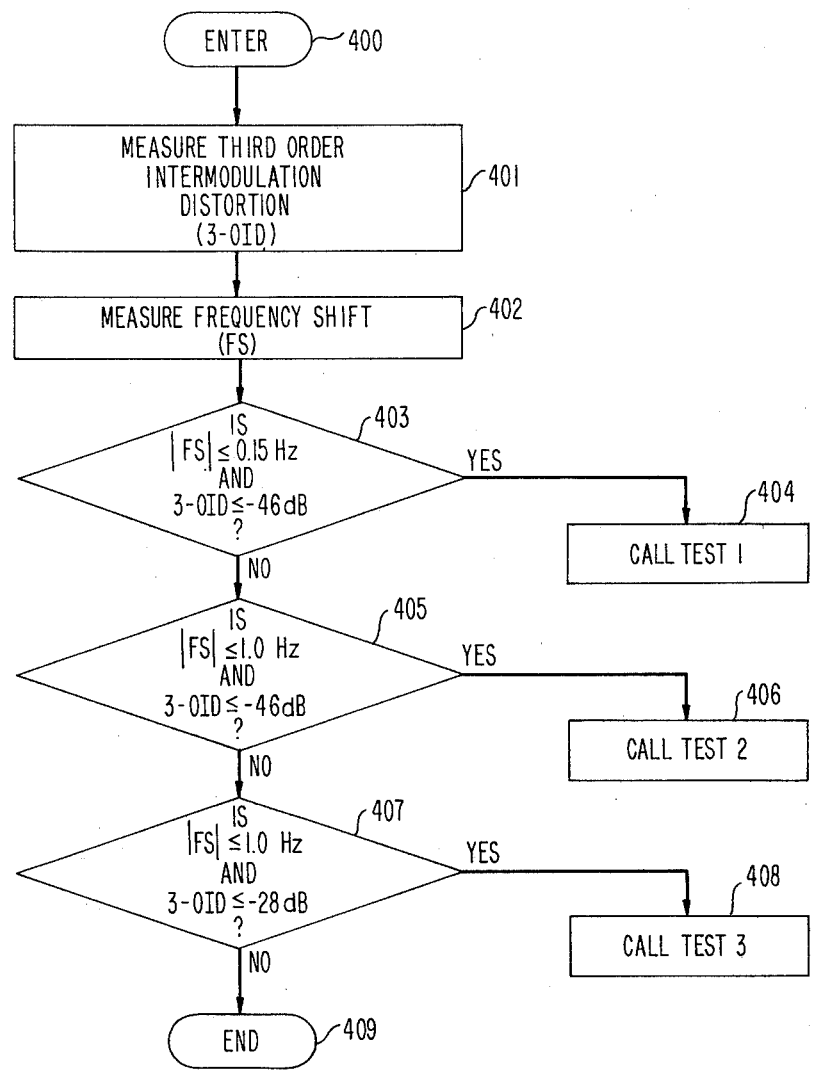
FIG. 4 is a flowchart of a procedure including steps employed in one embodiment of the invention for obtaining measurements of frequency response and envelope delay distortion of a facility under evaluation.

FIG. 4 shows in flowchart form applicants' unique test procedure in which data is obtained via test units 102 and 103 under control of central control 101 to generate desired measurements of frequency response and envelope delay distortion of facility 105. Three different symbols are shown: oval symbols indicate the beginning and ending of the routine; rectangular symbols, commonly referred to as operational blocks, contain the description of a particular operational step; and diamond symbols, commonly referred to as conditional branch points, contain a description of a test performed to determine the next operation to be performed.

The test procedure is entered via oval 400. Then, operational block 401 causes the system of FIG. 1 to obtain a measure of third order intermodulation distortion products on facility 105. This measurement of intermodulation distortion will be typically made as a separate test as described in our copending application, Ser. No. 107,787, noted above. Thus, in practice, the value of third order intermodulation distortion (30 ID) is already in memory.

Operational block 402 controls the system of FIG. 1 to obtain a measure of frequency shift on facility 105, in a manner to be described below.

Conditional branch point 403 tests the values of |FS| and 30 ID to determine if they are within first predetermined limits, in this example, |FS|≦0.15 Hz and 30 ID≦−46 dB. If the test results is "yes," control is transferred to operational block 404 and frequency response and envelope delay distortion Test 1 subroutine is called. The Test 1 subroutine is described below. If the test result is "no," control is transferred to conditional branch point 405.

Conditional branch point 405 tests the value of |FS| and 30 ID to determine if they are within second predetermined limits, in this example, |FS|≦1.0 Hz and 30 ID≦−46 dB. If the test result is "yes," control is transferred to operational block 406 and Test 2 subroutine is called. The Test 2 subroutine is described below. If the test result is "no," control is transferred to conditional branch point 407.

Conditional branch point 407 tests the values of |FS| and 30 ID to determine if they are within third predetermined limits, in this example, |FS|≦1.0 Hz and 30 ID≦−28 dB. If the test result is "yes," control is transferred to operational block 408 and Test 3 subroutine is called. The Test 3 subroutine is described below. If the test result is "no," control is transferred to oval 409 and the routine is ended. However, if the test result is "no," Test 3 still may be run and test results obtained with a diagnostic note that the system requirements have been exceeded and that the test results may be suspect.

By way of example, the following commands are sent from central control 101 to test units 102 and 103 to effect straightaway testing of facility 105 for frequency shift, frequency response and envelope delay distortion. Again, it is noted that the same test signal is used for frequency response and envelope delay distortion measurements. The test results are employed as described below to obtain measurements of frequency response and envelope delay distortion. Either of test units 102 or 103 may be employed as a transmitter or receiver. In this example, test unit 102 is employed as a transmitter and test unit 103 is employed as a receiver.

Commands for obtaining frequency shift data and an explanation are as follows:

| COMMANDS | EXPLANATION |
|---|---|
| Ⓐ | START I/O |
| XR | TEST UNIT 103 ADDRESS |
| 7A | TRANSMIT PROGRAM A |
| LX | |
| F@ | PROGRAM A |
| IO | |
| E | END STRING |
| 8A | EXECUTE PROGRAM A |
| 7B | TRANSMIT PROGRAM B |
| A | PROGRAM B |
| E | END STRING |
| 7C | TRANSMIT PROGRAM C |
| SA | PROGRAM C |
| E | END STRING |
| Ⓐ | START I/O |
| XT | TEST UNIT 102 ADDRESS |
| 7D | TRANSMIT PROGRAM D |
| LX | |
| OX | PROGRAM D |
| WA | |
| G@ | |
| E | END STRING |
| 8D | EXECUTE PROGRAM D |
| Ⓐ | START I/O |
| XR | TEST UNIT 103 ADDRESS |
| 8B | EXECUTE PROGRAM B |
| *8C | EXECUTE PROGRAM C |
| *2 | TRANSMIT RECORD |
| Ⓐ | START I/O |
| XT | TEST UNIT 102 ADDRESS |
| 3 | STOP TRANSMITTER |

Steps between asterisks (*) are repeated for each additional data record collected.

Commands for frequency response and envelope delay distortion, assuming the frequency shift (FS) and third order intermodulation distortion are within the first set of prescribed limits, and an explanation are as follows (Test 1):

| COMMANDS | EXPLANATION |
|---|---|
| Ⓐ | START I/O |
| XR | TEST UNIT 103 ADDRESS |
| 7A | TRANSMIT PROGRAM A |
| LX | |
| F@ | PROGRAM A |
| IO | |
| E | END STRING |
| 8A | EXECUTE PROGRAM A |
| 7B | TRANSMIT PROGRAM B |
| A | PROGRAM B |
| E | END STRING |
| 7E | TRANSMIT PROGRAM E |
| SP | PROGRAM E |
| E | END STRING |
| Ⓐ | START I/O |
| XT | TEST UNIT 102 ADDRESS |
| 7F | TRANSMIT PROGRAM F |
| LX | |
| OX | PROGRAM F |
| WC | |
| G@ | |
| E | END STRING |
| 8F | EXECUTE PROGRAM F |
| Ⓐ | START I/O |
| XR | TEST UNIT 103 ADDRESS |
| 8B | EXECUTE PROGRAM B |
| *8E | EXECUTE PROGRAM E |
| *2 | TRANSMIT RECORD |
| Ⓐ | START I/O |
| XT | TEST UNIT 102 ADDRESS |
| 3 | STOP TRANSMITTER |

Steps between asterisks (*) are repeated for each additional data record collected.

Commands for frequency response and envelope delay distortion, assuming that frequency shift (FS) and third order intermodulation distortion are within the second set of limits, and an explanation are as follows (Test 2):

| COMMANDS | EXPLANATION |
|---|---|
| Ⓐ | START I/O |
| XR | TEST UNIT 103 ADDRESS |
| 7A | TRANSMIT PROGRAM A |
| LX | |
| F@ | PROGRAM A |
| IO | |
| E | END STRING |
| 8A | EXECUTE PROGRAM A |
| 7B | TRANSMIT PROGRAM B |
| A | PROGRAM B |
| E | END STRING |
| 7G | TRANSMIT PROGRAM G |
| SC | PROGRAM G |
| E | END STRING |
| Ⓐ | START I/C |
| XT | TEST UNIT 102 ADDRESS |
| 7F | TRANSMIT PROGRAM F |
| LX | |
| OX | PROGRAM F |
| WB | |
| G@ | |
| E | END STRING |
| 8F | EXECUTE PROGRAM F |
| Ⓐ | START I/O |
| XR | TEST UNIT 103 ADDRESS |
| 8B | EXECUTE PROGRAM B |
| *8G | EXECUTE PROGRAM G |
| *2 | TRANSMIT RECORD |
| Ⓐ | START I/O |
| XT | TEST UNIT 102 ADDRESS |
| 3 | STOP TRANSMITTER |

Steps between asterisks (*) are repeated for each additional data record collected.

Commands for frequency response and envelope delay distortion tests, assuming that frequency shift (FS) and third order intermodulation distortion are within the third set of prescribed limits, i.e., worst case, and an explanation are as follows (Test 3):

| COMMANDS | EXPLANATION |
|---|---|
| Ⓐ | START I/O |
| XR | TEST UNIT 103 ADDRESS |
| 7A | TRANSMIT PROGRAM A |
| LX | |
| F@ | PROGRAM A |
| IO | |
| E | END STRING |
| 8A | EXECUTE PROGRAM A |
| 7H | TRANSMIT PROGRAM H |
| A | |
| | PROGRAM H |
| SC | |
| E | END STRING |
| Ⓐ | START I/O |
| XT | TEST UNIT 102 ADDRESS |
| 7I | TRANSMIT PROGRAM I |
| LX | |
| | PROGRAM I |
| OX | |
| E | END STRING |
| 8I | EXECUTE I |
| 7J | TRANSMIT PROGRAM j |
| W@ | |
| | PROGRAM J |
| G@ | |
| E | END STRING |
| Ⓐ | START I/O |
| XT | TEST UNIT 102 ADDRESS |
| 6@ | LOAD RAM 225 PROM MODEM |
| 8J | EXECUTE PROGRAM J |
| Ⓐ | START I/O |
| XR | TEST UNIT 103 ADDRESS |
| 8H | EXECUTE PROGRAM H |
| *2 | TRANSMIT RECORD |
| Ⓐ | START I/O |
| XT | TEST UNIT 102 ADDRESS |
| 3 | STOP TRANSMITTER |

Steps between asterisks (*) are repeated for each additional data record collected.

It will be apparent to those skilled in the art that each of test units 102 and 103 communicates reception of valid commands and its status to central control 101.

FIGS. 5 through 8 show flowcharts of program routines including steps performed in gathering data to be used in obtaining measures of frequency shift employing a 1-tone signal, and frequency response and envelope delay distortion employing a 21-tone signal. The programs are essentially the commands set out above, which are stored in RAM 303 of control unit 201 in test unit 102 or test unit 103.

Consequently, test units 102 and 103 are configured into transmitting and receiving units to effect the desired measurements. It will be apparent to those skilled in the art from the above information how to generate appropriate program listings for the data gathering routines.

The flowcharts include three different symbols; oval symbols indicate the beginning and ending of routine; the rectangular symbols, commonly referred to as operational blocks contain the description of a particular detailed operational step; and diamond symbols, commonly referred to as conditional branch points, contain a description of a test performed by control unit 201 for enabling it to determine the next operation to be performed.

Figure 5:
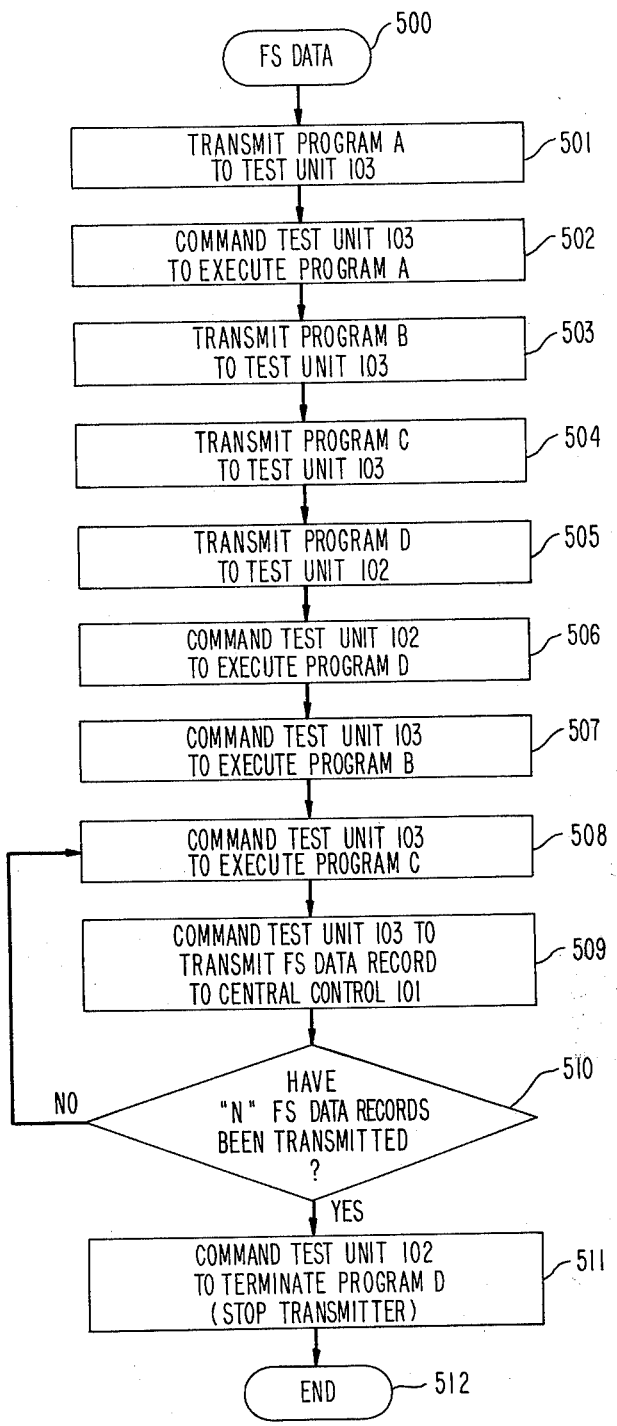
FIG. 5 shows a flowchart of a program routine illustrating a sequence of steps employed in one embodiment of the invention for obtaining data in the system of FIG. 1 to realize a measurement of frequency shift of the facility under evaluation employed in the procedure shown in FIG. 4.

As shown in FIG. 5, the frequency shift (FS) test data acquisition procedure routine is entered at oval 500. Operational block 501 causes central control 101 to transmit program A, as set out above, to test unit 103. Program A includes a string of commands, as set out above, for setting line configuration unit 202 to a desired impedance, i.e., 600 ohms or 900 ohms; input attenuator 203 to a prescribed mid-range value; and line filter 204 to a specific filter configuration as set out above.

Operational block 502 causes central control 101 to transmit a command to test unit 103, instructing it to execute program A. Thus, the receiver input characteristics are set.

Operational block 503 causes central control 101 to transmit program B, as set out above, to test unit 103. Program B controls auto-ranging of input attenuator 203 to optimize the incoming signal level to the maximum allowed level without overloading ADC 207.

Operational block 504 causes central control 101 to transmit program c, as set out above, to test unit 103. Program C controls ADC 207 to take 512 twelve-bit samples, i.e., a record of the received signal.

Operational block 505 causes central control 101 to transmit program D, as set out above, to test unit 102. Program D controls setting of line configuration unit 211 to a specific impedance similar to that of line configuration unit 202; sets output attenuator 210 to a specific value; selects a 1-tone signal in test signal storage and select unit 220, a 1016 Hz signal stored in digital form in PROM 222; and controls DAC 208 to continuously generate the 1-tone, 1016 Hz signal from the digital information stored in PROM 222.

Operational block 506 causes central control 101 to transmit a command to test unit 102, instructing it to pre-execute program D and, then, the 1-tone test signal is supplied via the output port of DAU 121 to facility 105.

Operational block 507 causes central control 101 to transmit a command to test unit 103, instructing it to execute program B.

Operational block 508 causes central control 101 to transmit a command to test unit 103, instructing it to execute program C. Thus, test unit 103 is obtaining a set of successive data records (measurements) of the received 1-tone test signal, in this example, the number (Y) of records is 1.

Operational block 509 causes central control 101 to transmit a command to test unit 103, instructing it to transmit an FS data record to central control 101.

Conditional branch point 510 tests to determine whether an ensemble of N FS data records have been transmitted. The ensemble number (N) of records utilized in a particular test is selected to obtain a desired overall accuracy of measurement between successive measurement results; in this example from experimental practice, it is desired to have a maximum variation for all system errors of ±0.05 Hz. In this example, for FS testing, N=6. If the test result is "yes," control is transferred to operational block 511. However, if the test result is "no," control is transferred to operational block 508, and the operations of blocks 508 and 509 are iterated until conditional branch point 510 yields a "yes" test result.

Operational block 511 causes central control 101 to transmit a command to test unit 102, instructing it to terminate program D, i.e., to stop transmitting the 1-tone signal. Control is thereafter transferred to operational block 512 and the routine is ended.

Figure 6:
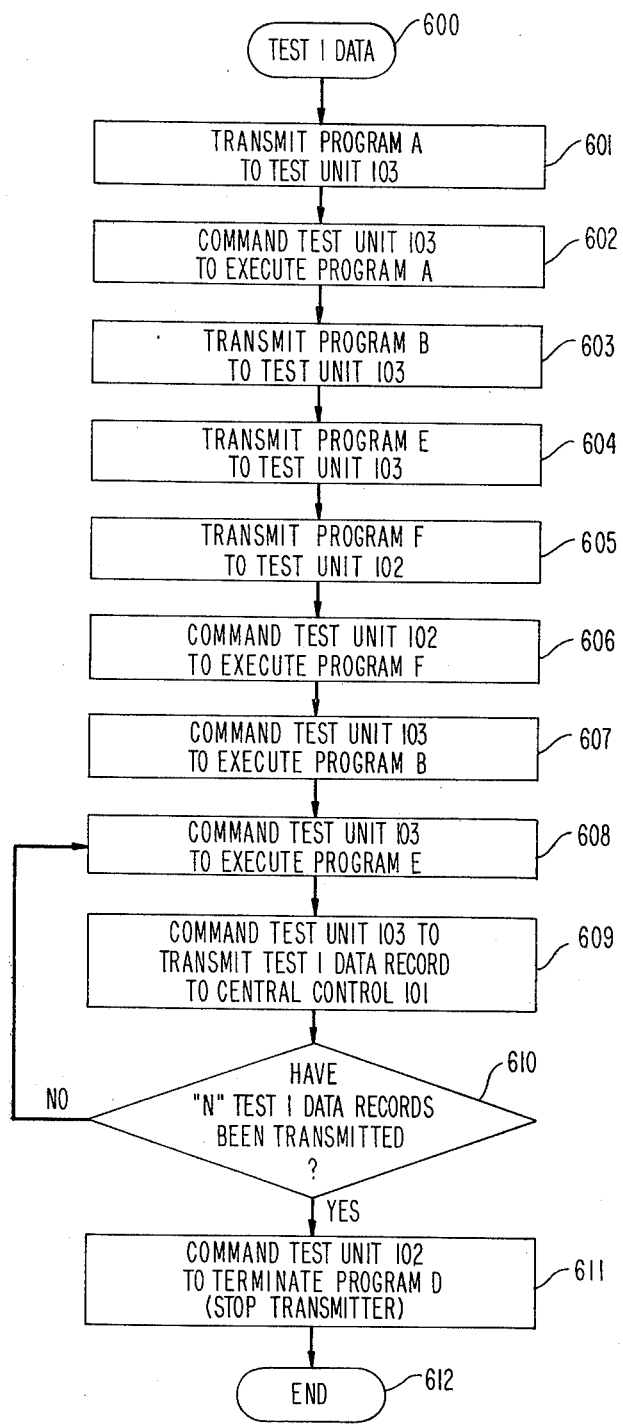
FIGS. 6, 7 and 8 show flowcharts of program routines, illustrating sequences of steps employed in obtaining test data for use in the routine of FIG. 4 to be employed in generating Test 1, 2 and 3 measurements, respectively, of frequency response and envelope delay distortion.

FIG. 6 shows a flowchart of steps performed in obtaining data for frequency response and envelope delay distortion Test 1. As indicated above, Test 1 is employed when measurements of frequency shift and third order intermodulation distortion are within first predetermined limits. Steps 600 through 612 shown in FIG. 6 are essentially identical to steps 500 through 512 of FIG. 5, except that program E transmitted to test unit 103 in operational block 604 includes a command to cause a set including a predetermined number (Y) of successive Test 1 data records to be taken and time-averaged when program E is executed in operational block 608. In this example, the number (Y) of Test 1 data records taken and time-averaged is 16. Additionally, program F transmitted to test unit 102 in operational block 605 includes a command instructing control 201 to select PROM 224 for generating applicants' unique 21-tone test signal employed in Test 1 when executed in block 606. In this example, the number (N) of successively obtained, time-averaged sets of Test 1 data records in an ensemble to be transmitted to central control 101, as determined in conditional branch point 610, is 6. Thus, as indicated above, test unit 103 is controlled to take 16 data records per set which are time-averaged and to transmit an ensemble of 6 sets of the time-averaged data records to central control 101. Therefore, in this example, 6×16=96 data records are taken by test unit 103 of the Test 1 signal transmitted from test unit 102 over facility 105.

Figure 7:
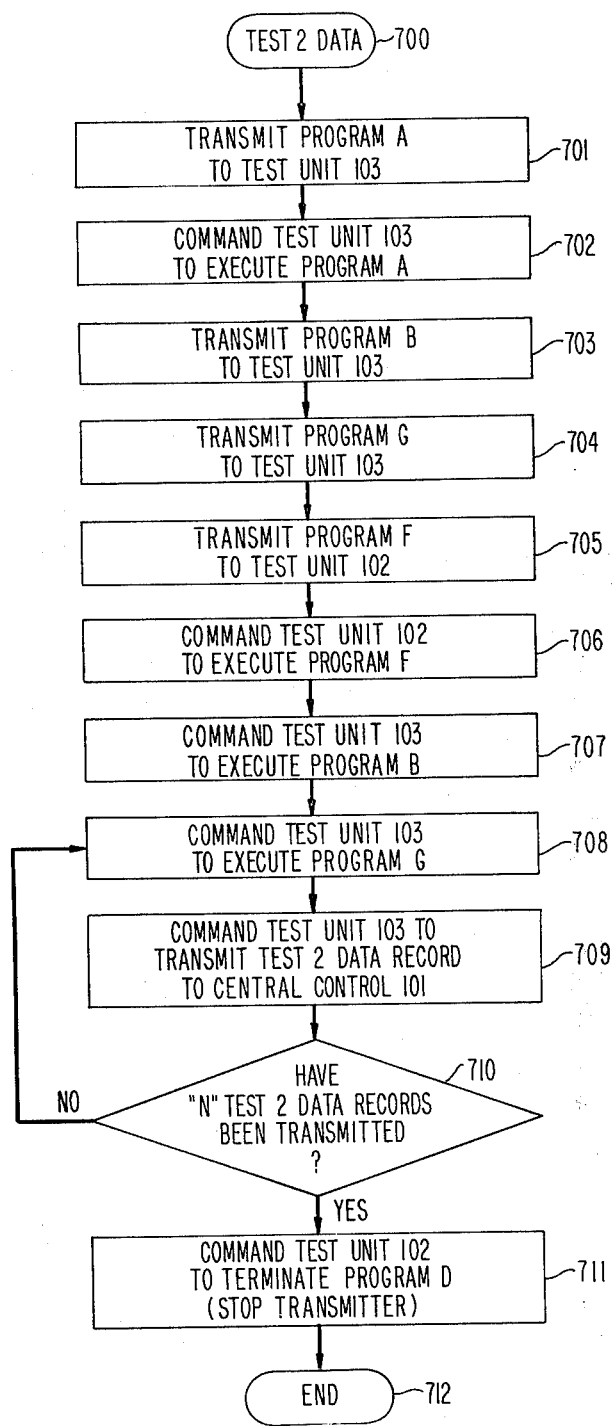

FIG. 7 shows a flowchart of steps performed in obtaining data for frequency response and envelope delay distortion Test 2. As indicated above, Test 2 is employed when measurements of frequency shift and third order intermodulation distortion are within second predetermined limits. Steps 700 through 712, shown in FIG. 7, are essentially identical to steps 600 through 612, shown in FIG. 6, except that program G in operational block 704 includes an instruction to cause a set to include a predetermined number (Y) of Test 2 data records to be taken and time-averaged when program G is executed in operational block 708. In this example, the number (Y) of Test 2 data records taken and time-averaged per set is 3. Additionally, the number (N) sets of time-averaged data records in an ensemble to be transmitted to central control 101, as determined in conditional branch point 710, is 21. Thus, as indicated above, test unit 103 is controlled via control 201 to take 3 data records which are time-averaged per set and to transmit an ensemble of 21 successively obtained sets of the time-averaged data records to central control 101. Therefore, in this example, 3×21=63 data records are taken by test unit 103 in gathering data for Test 2.

Figure 8:
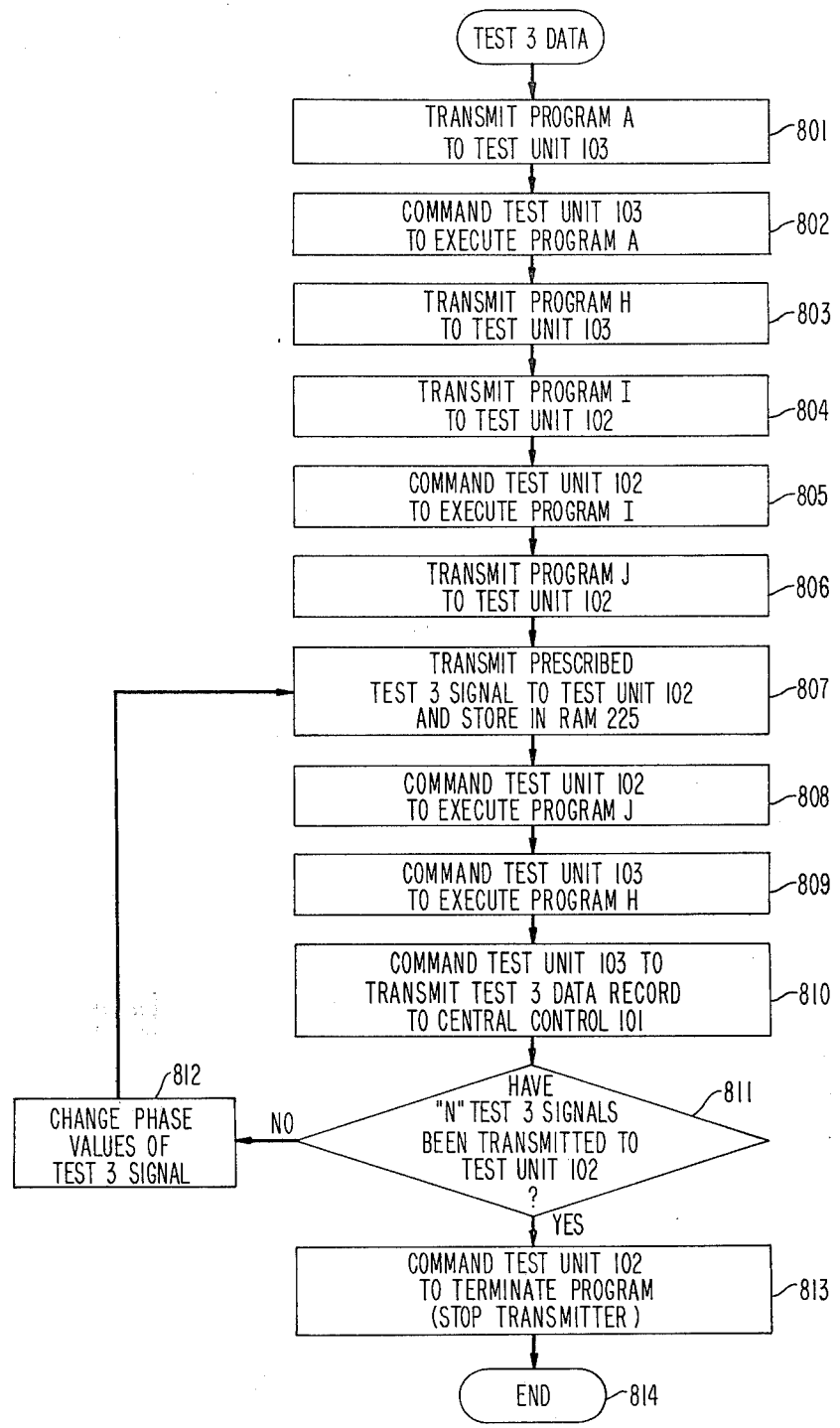

FIG. 8 shows a flowchart of steps performed in obtaining data for frequency response and envelope delay distortion Test 3. As indicated above, Test 3 is employed when measurements of frequency shift and third order intermodulation distortion are within third predetermined limits. In Test 3, applicants employ a unique test procedure in which, in this example, 21 test signals, each including 21 tones having phase relationships determined in accordance with prescribed criteria, as described above. Steps 800–802 are identical to steps 500–502 described above in relationship to FIG. 5.

Operational block 803 causes central control 101 to transmit program H, as set out above, to test unit 103. Program H controls auto-ranging of input attenuator 203 to optimize the incoming signal level to the maximum level allowable without overloading ADC 207. Additionally, program H causes control unit 201 to obtain three successive data records of the incoming Test 3 signal and time-average them. That is to say, number Y of data records to be time-averaged, in this example, is 3.

Operational block 804 causes central control 101 to transmit program I, as set out above, to test unit 102. Program I controls setting of line configuration unit 211 to a specific impedance similar to that of line configuration unit 202. Operational block 805 causes central control 101 to transmit a command to test unit 102, instructing it to execute program I.

Operational block 860 causes central control 101 to transmit program J, as set out above, to test unit 102. Program J controls selecting a test signal stored in RAM 225 and controls DAC 208 to continuously generate that signal.

Operational block 807 causes central control 101 to transmit applicants' unique 21-tone test signal, as described above, to test unit 102 and to store digital representations of that signal in RAM 225.

Operational block 808 causes central control 101 to transmit a command to test unit 102, instructing it to execute program J and, then, the 21-tone test signal stored in RAM 225 is supplied via DAC 208, low pass filter 209, output attenuator 210, line configuration unit 211 and the output port of DAU 121 to facility under evaluation 105.

Operational block 809 causes central control 101 to transmit a command to test unit 103 instructing it to execute program H, thereby obtaining a set of three consecutive 512 twelve-bit data records of the incoming Test 3 signal which are time-averaged.

Operational block 810 causes central control 101 to transmit a command to test unit 103, instructing it to transmit a time-averaged Test 3 data record to central control 101.

Conditional branch point 811 tests to determine whether N Test 3 signals have been transmitted to test unit 102. In this example, N=21. If the test result is "yes", control is transferred to operational block 813. However, if the test result is "no," control is transferred to operational block 812, which causes the phase values assigned to the individual tones in the Test 3 signal to be rotated in counterclockwise, circular fashion, as described above. Thereafter, control is transferred to operational block 807 and the steps of operational blocks 807 through 810, conditional branch point 811 and operational block 812 are iterated until the test in conditional branch point 811 yields a "yes" result. That is to say, an ensemble of 21 time-averaged data records corresponding to the 21 test signals in Test 3 are transmitted to central control 101.

Operational block 813 causes central control 101 to transmit a command to test unit 102 to terminate program J, that is to say, stop transmitting test signals. Thereafter, Test 3 data subroutine is ended via oval 814.

The appendix includes program listings of electrical control signals, which configure computer 110 for obtaining a measure of frequency shift; a subroutine (Y 1822) for computing the frequency shift; a subroutine employing the data collected from either Tests 1, 2 or 3 for obtaining a measure of frequency response and envelope delay distortion; and a subroutine (Y 1879) for computing the envelope delay distortion measurement values.

The program functions shown in the program listings are, for the most part, included as subroutines in the H-P 5451B Fourier Analyzer Software System noted above.

Thus, once a measure of third order intermodulation distortion and frequency shift FS, and Test 1, Test 2 or Test 3 data records obtained as described above are stored on disc memory in computer 110, they are utilized to obtain a measure of frequency response and envelope delay distortion. The frequency shift FS measurement and third order intermodulation distortion values are employed to determine which one of the frequency response and envelope delay distortion tests is to be employed in obtaining the desired measurements.

A list of electrical control signals, which configures computer 110 into an arrangement for obtaining a measure of frequency shift of facility 105, is set out in the frequency shift listing in the Appendix.

Figure 9:
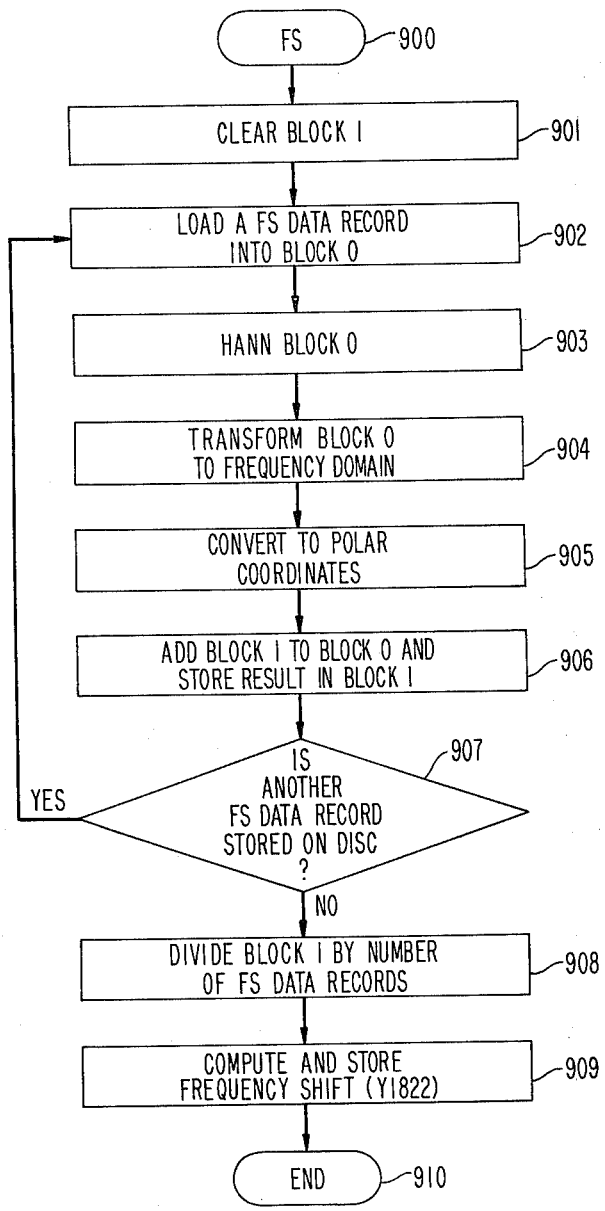
FIG. 9 is a flowchart of a program routine illustrating a sequence of steps employed in generating a measure of frequency shift utilizing the data obtained in the procedure illustrated in FIG. 5.

The frequency shift program listing and, hence, operation of computer 110 for obtaining a measure of frequency shift is more readily understood with the aid of the flowchart shown in FIG. 9. Accordingly, the program routine is entered via oval 900; thereafter, control is transferred to operational block 901.

Operational block 901 operates to clear block 1 in core memory of computer 110.

Operational block 902 causes computer 110 to load one of the FS data records from disc memory into block $\phi$ of core memory.

Operational block 903 causes computer 110 to Hann the data in block $\phi$ of core memory. As is well known, Hanning is a time-weighted function employed to minimize the effects of so-called "leakage" in the data. As will be apparent when a data input is not periodic in nature, with respect to the sampling interval, so-called leakage can occur.

Operational block 904 causes computer 110 to transform the data in block $\phi$ from the time domain into the frequency domain, i.e., Fourier transforms it.

Operational block 905 causes the frequency domain data in block $\phi$ to be transformed from rectangular to polar coordinates.

Operational block 906 causes the data in block 1 to be added to the data in block $\phi$ and to store the results in block 1. This generates a running measure of frequency shift.

Conditional branch point 907 performs a test to determine if another FS data record is stored on disc memory. If the test result is "no," control is transferred to operational block 908; if the test result is "yes," control is again transferred to operational block 902 and steps 902 through 907 are repeated until a "no" result is obtained.

Operational block 908 causes the running measure value stored in block 1 to be divided by the number (N) of FS data records, in this example, 6, and to store the result for later use. This operation results in obtaining the average voltage components used in computing frequency shift.

Operational block 909 causes the frequency shift value to be computed in accordance with FS computation subroutine Y1822 illustrated in the corresponding program listing included in the appendix and described below.

The FS subroutine is ended via oval 910.

A listing of electrical control signals which configures computer 110 into an arrangement for computing a value of frequency shift is set out in the Y1822 subroutine listing in the appendix.

Figure 10:
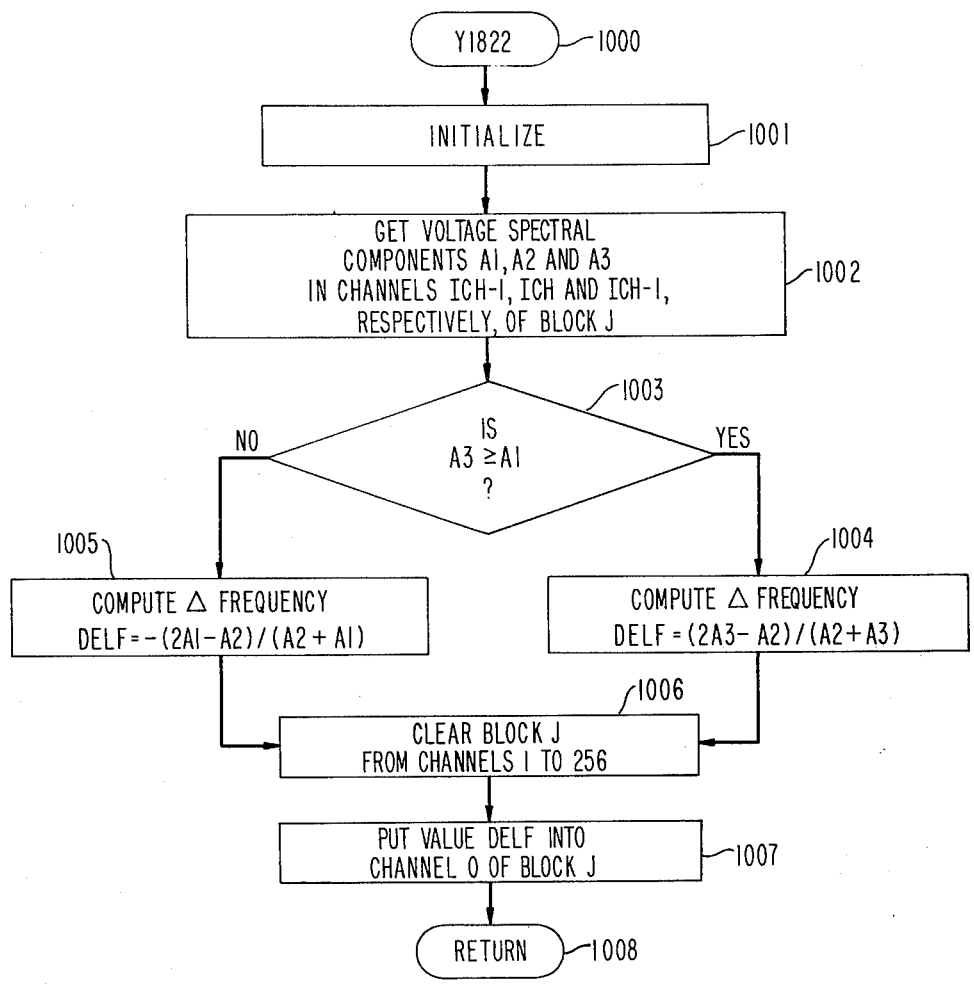
FIG. 10 shows a flowchart of a program routine employed for computing the value of frequency shift in the routine of FIG. 9.

The frequency shift computational program listing Y1822 and, hence, operation of computer 110 for obtaining a value of frequency shift is more readily understood with the aid of the flowchart shown in FIG. 10. Accordingly, frequency shift computational routine Y1822 is entered via oval 1000. Thereafter, control is transferred to operational block 1001 to initialize the routine.

Operational block 1002 causes computer 110 to obtain voltage spectral components A1, A2 and A3 in channels ICH−1, ICH and ICH+1, respectively, of Block J in core memory. These are the average amplitude values of the frequency components of the 1016 Hz test signal transmitted over facility 105.

Conditional branch point 1003 performs a test to determine if amplitude component A3 is equal to or greater than amplitude component A1. This test determines whether the amplitude component in a higher adjacent channel to the test signal frequency transmitted is equal to or greater than the amplitude component in the lower adjacent frequency channel to the test signal frequency transmitted. If the test result is "yes," i.e., A3 is equal to or greater than A1, control is transferred to operational block 1004. However, if the test result is "no," i.e., A3 is less than A1, control is transferred to operational block 1005.

Operational block 1004 causes a $\Delta$ frequency (DELF) to be computed in accordance with $$DELF = (2A3 - A2)/(A2 + A3).$$

Thereafter, control is transferred to operational block 1006.

Operational block 1005 causes computer 110 to compute Δ frequency (DELF) in accordance with $$DELF = -(2A1 - A2)/(A2 + A1).$$

Operational block 1006 causes block J in core memory to be cleared from channels 1 to 256.

Operational block 1007 causes the DELF value computed above to be put into channel $\phi$ of block J. Thus, the DELF value is stored for use in computing frequency shift in the main program, namely, by multiplying DELF by the aperture frequency of 15.625 Hz.

Control is returned to the main FS program via oval 1008.

Figure 11:
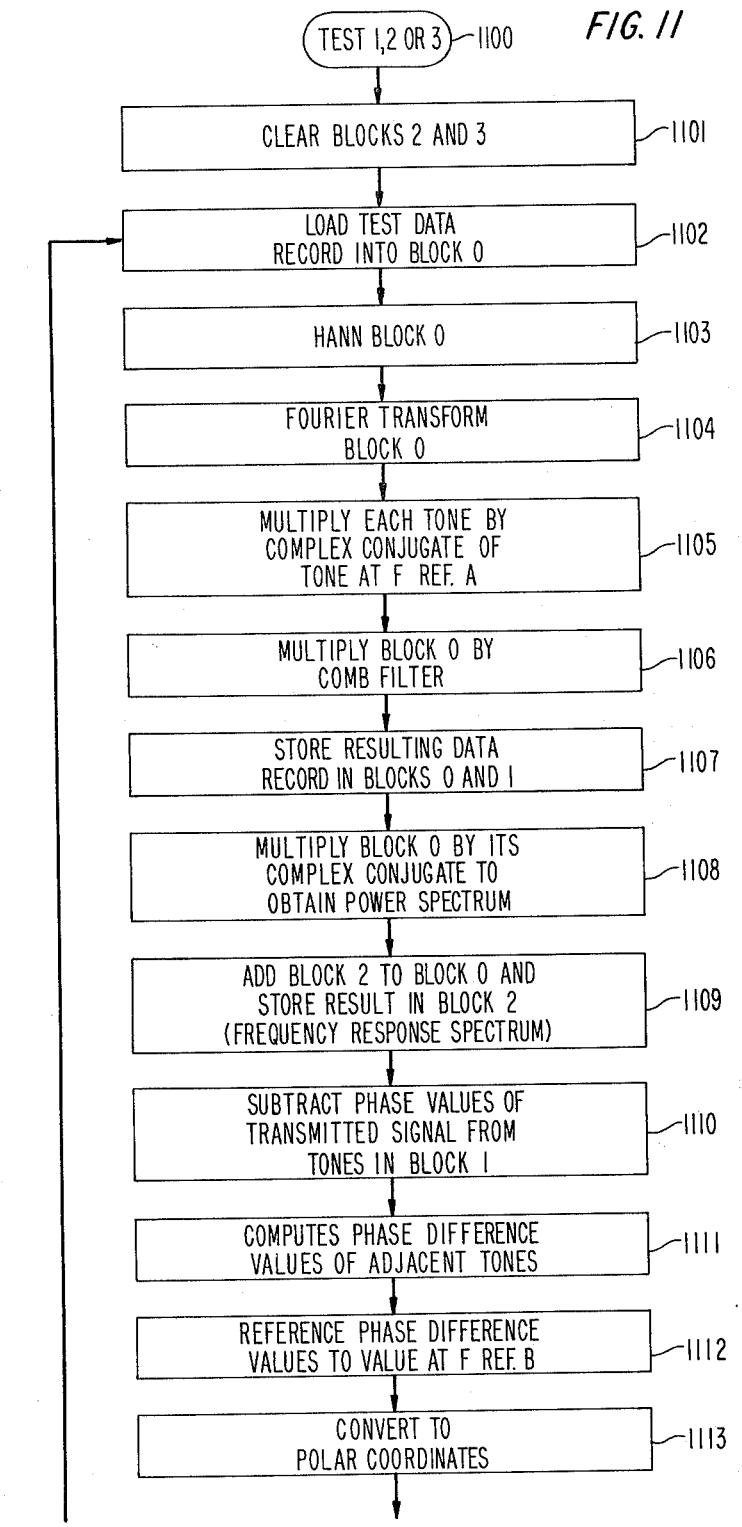
FIGS. 11 and 12, when connected as shown in FIG. 13, is a flowchart of program routines, illustrating sequences of steps employed in utilizing the test data obtained in the routines of FIGS. 6, 7 or 8 to obtain Test 1, 2 or 3 measurements, respectively, of frequency response and envelope delay distortion.
Figure 12:
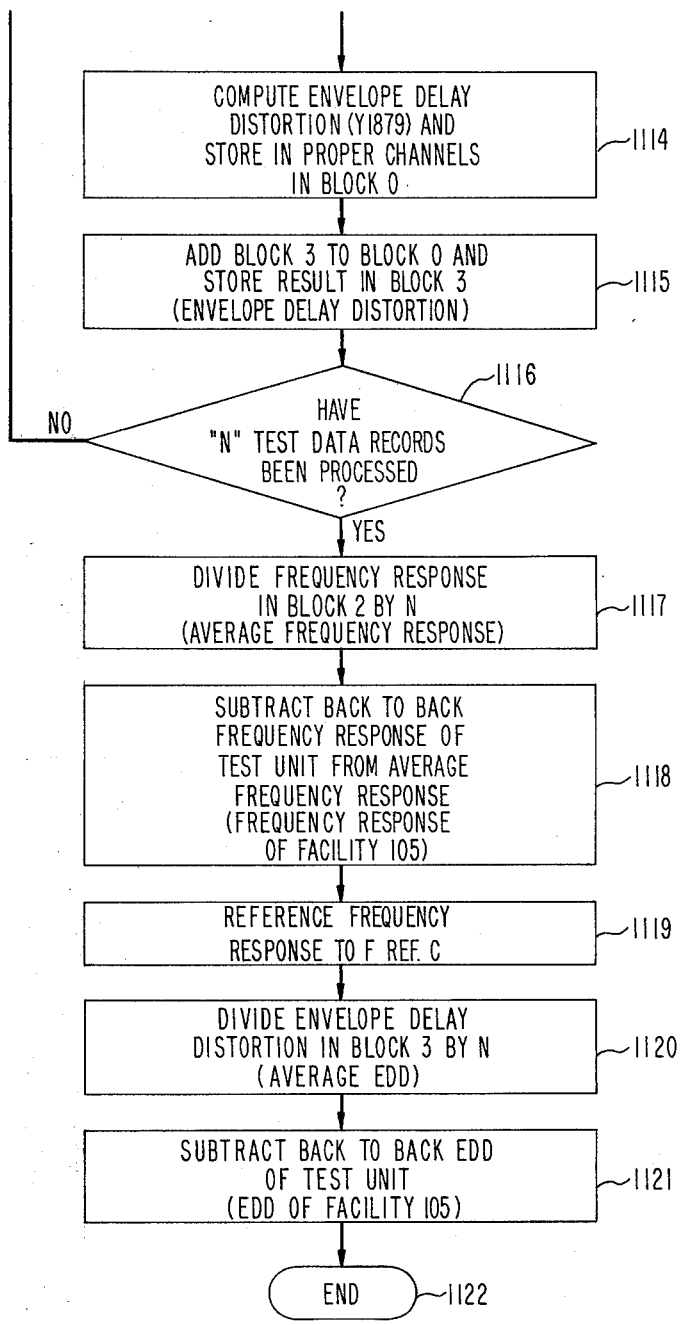

Listings of electrical control signals which configure computer 110 into arrangements for obtaining measurements of frequency response and envelope delay distortion of facility 105 are set out in the Test 1, Test 2 and Test 3 program listings in the appendix. The frequency response and envelope delay distortion program listings and, hence, operation of computer 110 for obtaining measurements of frequency response and envelope delay distortion are more readily understood with the aid of the flowchart shown in FIGS. 11 and 12 when connected as shown in FIG. 13. It should be noted that the steps in computing the frequency response and envelope delay distortion are substantially identical for all three tests; however, the data employed in each of those procedures is different, as described above. Accordingly, the program routine is entered via oval 1100. Thereafter, control is transferred to operational block 1101.

Operational block 1101 operates to clear blocks 2 and 3 in core memory of computer 110.

Operational block 1102 causes computer 110 to load a test data record, i.e., either Test 1, 2 or 3 data record into block $\phi$ in core memory.

Operational block 1103 causes computer 110 to Hann the data in block 3 of core memory. As indicated above, this function minimizes the effects of so-called leakage in the data.

Operational block 1104 causes computer 110 to transform the data in block $\phi$ from the time domain into the frequency domain, i.e., Fourier transforms it.

Operational block 1105 causes each tone in the frequency domain data to be multiplied by the complex conjugate of the tone at reference frequency A (F REF.A). In this example, reference frequency A corresponds to channel 123 or 1921.875 Hz.

Operational block 1106 causes the data in block $\phi$ to be multiplied by a comb filter function to filter out everything except the individual test frequency components.

Operational block 1107 causes the resulting data record to be stored in blocks $\phi$ and 1 of core memory.

Operational block 1108 causes the data in block $\phi$ to be multiplied by its complex conjugate to obtain a power spectrum for frequency response.

Operational block 1109 causes the data in block 2 to be added to the data in block $\phi$ and to store the result in block 2. (This is a running value of the frequency response spectrum.)

Operational block 1110 causes the phase values of the transmitted test signal to be subtracted from the tones represented by the data stored in block 1. It should be noted that in Tests 1 and 2, the phase values are fixed for each iteration of the test procedure. However, in Test 3 the phase values change for each iteration in the same manner as in the transmitted signal, i.e., the phase values of the tones are reassigned, in this example, not intended to limit the scope of the invention, in counterclockwise, circular fashion with each iteration until all the phase values have been assigned to each tone in the Test 3 signal.

Operational block 1111 causes computer 110 to compute the phase difference values of adjacent tones in the test signal, i.e., the difference between T1 and T2, T2 and T3 ... T(N-1)-TN, where, in this example, N=21. Thus, 20 phase difference values are computed.

Operational block 1112 causes computer 110 to reference the phase difference values computed above to the phase difference value at reference frequency B (F REF.B). In this example, reference frequency B is in channel 118 or 1843.75 Hz. It should be noted that this is a mere convenience, and the envelope delay distortion to be computed from the phase difference values can be referenced to any desired frequency. It is the practice to reference it to the frequency at which the minimum envelope delay distortion is found. This ensures that all subsequent measurements are positive values.

Operational block 1113 causes the values in rectangular coordinates to be converted to polar coordinates. This is important to obtain both magnitude and phase values of the phase difference values. The magnitude values are not utilized; however, the phase values represent the normalized phase difference values needed to compute envelope delay distortion.

Operational block 1114 causes computer 110 to compute a value for envelope delay distortion by calling subroutine Y1879. The computed values are thereafter stored in proper channels in block $\phi$.

Operational block 1115 causes the data in block 3 to be added to block $\phi$ and the result to be stored in block 3. This is the running value of envelope delay distortion.

Conditional branch point 1116 tests to determine whether N test data records have been processed. As described above, the number (N) for Test 1, in this example, is 6, while the number (N) for Tests 2 and 3 is, in this example, 21.

Operational block 1117 causes the data in block 2 to be divided by N, i.e., Test 1, N=6; Tests 2 and 3, N=21, to obtain the average frequency response value.

Operational block 1118 causes computer 110 to subtract so-called back-to-back frequency response to the test unit from the average frequency response determined above. Back-to-back frequency response is obtained for each test unit by merely connecting the transmit and receive channels in data acquisition unit 121 (FIG. 2), by circuitry not shown, to obtain a value of the frequency response of the data acquisition unit. That is to say, the output of data acquisition unit 121 is connected to its input and frequency response measured as described above. This operation results in obtaining a value of frequency response of facility 105 only, i.e., the frequency response component attributable to the transmit and receive paths of the data acquisition units is subtracted from the measured value.

Operational block 1119 causes computer 110 to reference the frequency response of facility 105 to reference frequency C (F REF.C), in this example, the signal in channel 63 or 984.475 Hz.

Operational block 1120 causes the data in block 3 to be divided by N, i.e., Test 1, N=6; Tests 2 and 3, N=21, to obtain an average envelope delay distortion value.

Operational block 1121 causes computer 110 to subtract the so-called back-to-back envelope delay distortion value of the test units from the measured value to obtain a value of envelope delay distortion of facility 105. Again, the back-to-back envelope delay distortion of the test unit is obtained by connecting the output of the data acquisition unit to its input and measuring envelope delay distortion as described above.

The frequency response and envelope delay distortion routine is ended via oval 1122.

A listing of electrical control signals which configure computer 110 into an arrangement for utilizing the 20 phase difference values in computing a value for envelope delay distortion in microseconds is set out in the Y1879 subroutine listing in the appendix. Briefly, the Y1879 subroutine corrects for transitions that result from the Fourier analyzer routines in normalizing the phase difference values to the range −180 to +180 degrees. Since the Fourier analyzer routines are restricted to this phase difference range and since envelope delay distortion can be greater than 360 degrees, each instance of an envelope delay distortion value being outside the −180 to +180 degree range causes a transition which must be corrected to obtain a smooth transition from value to value. The corrections are valid as long as the envelope delay distortion values between adjacent tone frequencies do not differ by more than a predetermined delay value, in this example, 3200 microseconds or 180 degrees of phase difference.

Figure 15:
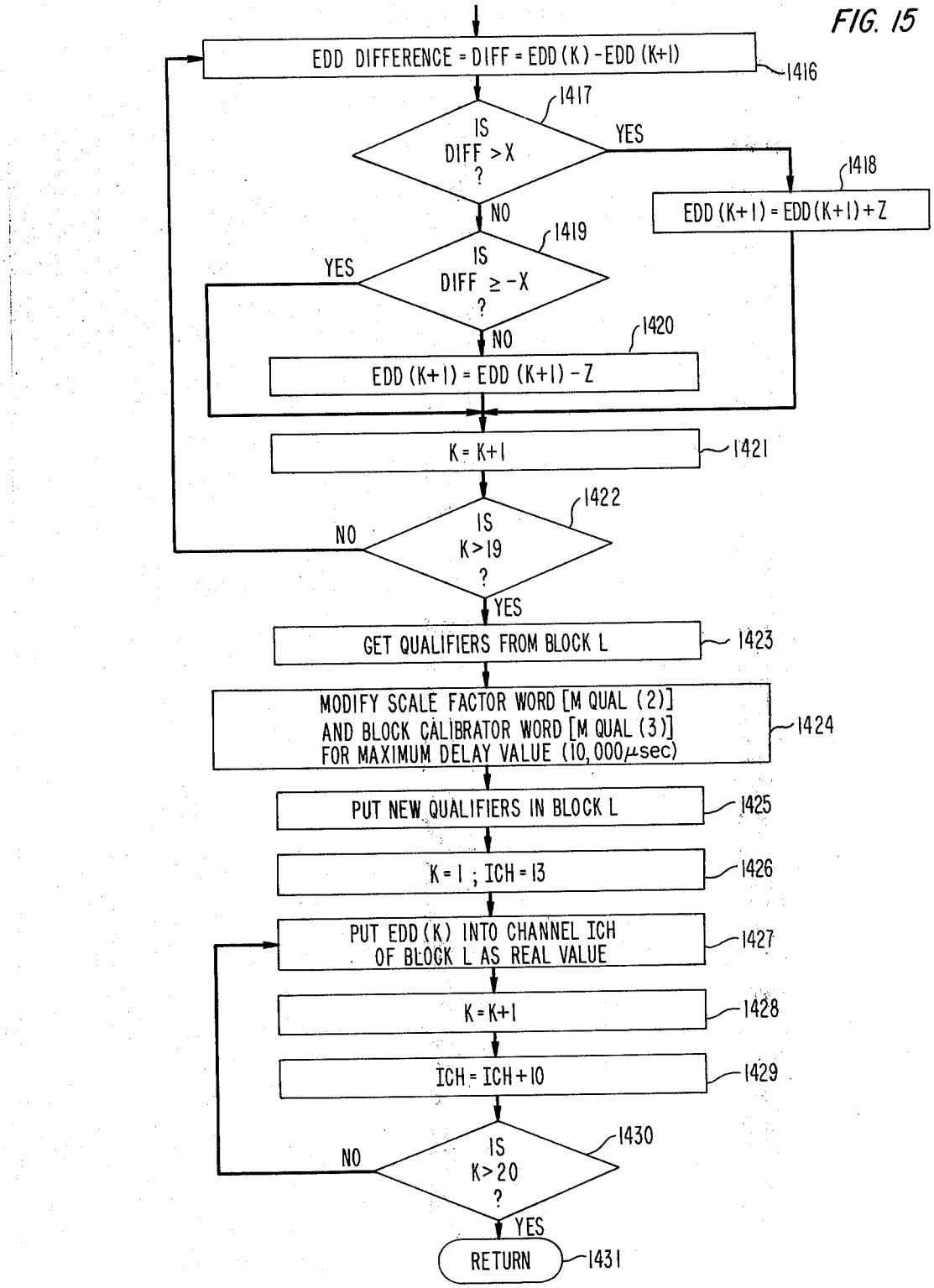

The phase difference correction procedure of computational program listing Y1879, and hence, operation of computer 110 for obtaining a corrected value for envelope delay distortion in microseconds, is more readily understood with the aid of the flowchart shown in FIGS. 14 and 15 when connected as shown in FIG. 16. Accordingly, th Y1879 subroutine is entered via oval 1400. Thereafter, control is transferred to operational block 1401.

Operational block 1401 initializes the routine to a predetermined channel for obtaining a first phase difference value, in this example, channel 13, and for setting an index, i.e., K=1.

Operational block 1402 calls to "get" a Δ phase value (DI) in the first channel of block L in core memory.

Operational block 1403 computes a value for envelope delay distortion in accordance with $$EDD(K) = DI/\Delta\omega,$$

wherein EDD(K) is the envelope delay distortio value, DI is the Δ phase value in the particular tone channel and Δω is the frequency difference between adjacent tone frequencies converted to degrees per second, in this example, equals 56,250 degrees/second.

Operational block 1404 causes the index to be updated, i.e., K=K+1.

Operational block 1405 causes the channel to be updated in which a phase difference value is to be obtained, i.e., ICH=ICH+10. An indexing by 10 channels is used because the phase difference values, in this example, are spaced every tenth channel. The channel indexing is selected to meet established standards in the industry, in this example, equivalent to an aperture frequency of 156.25 Hz.

Conditional branch point 1406 tests to determine if the channel value is greater than a predetermined channel number W, where W in this example is the highest anticipated channel where a phase difference value is to be obtained, namely, channel 203. If the test result is "yes," control is transferred to operational block 1407. If the test result is "no," control is returned to operational block 1402, and the steps in 1402 through 1406 are iterated until a "yes" result is obtained. That is to say, envelope delay distortion values are computed for each channel having a phase difference value.

Operational block 1407 sets index K to a predetermined value, in this example, to 11. This value is the phase difference value to which all the phase difference values have been previously normalized to.

Operational block 1408 causes the envelope delay distortion difference (DIFF) to be obtained between a predetermined one of the 20 values utilized in this example, and the next lower envelope delay distortion value, in this example, beginning with envelope delay distortion value corresponding to K=11.

Conditional branch point 1409 tests to determine if the envelope delay distortion difference (DIFF) is greater than a predetermined value X, where X, in this example, is the maximum allowable envelope delay distortion between adjacent tone frequencies and is equal to 3200 microseconds. If the test result is "no," control is transferred to conditional branch point 1410. The "no" test result in conditional branch point 1409 indicates that there was no transition in the normalization process. However, if the test result is "yes," control is transferred to operational block 1411. When a "yes" test result occurs, this indicates that there was a negative transition in the Fourier analyzer normalization process of either 360 degrees or 6400 microseconds of envelope delay.

Operational block 1411 corrects for the negative transition by adding (Z), i.e., 360 degrees or 6400 microseconds of envelope delay to the envelope delay value (K−1). Thereafter, control is transferred to operational block 1413.

Conditional branch point 1410 tests to determine if the envelope delay distortion difference (DIFF) is equal to or greater than −X, where X is the maximum allowable envelope delay distortion difference between adjacent tone frequencies, again, 3200 microseconds. A "yes" test result indicates that there is no transition in the normalization process and control is transferred to operational block 1413. However, a "no" test result indicates that the difference in the normalization process is greater than the maximum allowable and that there was a positive transition, which must be corrected for, and control is transferred to operational block 1412.

Operational block 1412 corrects the envelope delay distortion (K−1) value by subtracting (Z), in this example, 360 degrees or 6400 microseconds from that value.

Operational block 1413 decrements index K by 1, i.e., K=K−1.

Conditioal branch point 1414 tests to determine if K is less than 2 to determine if the envelope delay distortion values from K=11 through K=1 have been employed. If the test result is "yes," control is transferred to operational block 1415. However, if the test result is "no," control is returned to operational block 1408, and steps 1408 through 1414 are repeated until the lowest envelope delay distortion value has been reached, i.e., K=1.

Steps 1407 through 1414 correct the envelope delay distortion values from the mid-value, namely, K=11, through the lowest value, K=1, for transitions in the Fourier analyzer normalizing process. Steps 1415 through 1422 effect the same correction for the envelope delay distortion values from K=11 through K=20 and, therefore, a detailed description is deemed not necessary. Once the highest envelope delay distortion value, i.e., K=20, has been corrected as tested for in conditional branch point 1422, control is transferred to operational block 1423.

Operational blocks 1423 through 1425 merely assure that the computed envelope delay distortion values are presented in the memory block L to be within ±10,000 microseconds full-scale value for the Fourier analyzer display unit.

Operational block 1426 re-initializes the system to the previous initial conditions, i.e., K=1 and ICH=13.

Operational block 1427 puts the corrected envelope delay distortion values, i.e., envelope delay distortion (K), where K=1 through 20, into the appropriate channels of block L as real values.

Operational block 1428 increments the envelope delay distortion number, i.e., K=K+1.

Operational block 1429 increments the channel number, i.e., ICH=ICH+10.

Conditional branch point 1430 tests to determine if all the envelope delay distortion values have been put into their appropriate channels, namely, is K greater than 20? If the test result is "no," control is returned to operational block 1427 and steps 1427 through 1430 are repeated until a "yes" test result is obtained. Upon obtaining a "yes" test result, control is returned to the test program via oval 1431.

Although the example utilized in the above-described arrangements pertains to the voice frequency band, the invention is equally applicable to any other frequency band of interest.

APPENDIX

FREQUENCY SHIFT (FS)

POSITION DISC TO:
FIRST FS DATA RECORD FROM TEST UNIT 103.
PROGRAM:

```
 1 L      φ
 4 CL     1
 7 L      1
1φ MS    11    φ       LOADS NEXT FS DATA RECORD
                       INTO BLOCK φ.
14 H1                  HANNS BLOCK φ.
16 F                   FOURIER TRANSFORMS
18 TP                  CONVERT TO POLAR
                       COORDINATES
2φ A+     1
23 X>     1
26 #      1    N       REPEATS LINES 7 THRU 23
29 L      2            N OF TIMES AND AVERAGES,
                       N = 6.
32 Y   1822    φ   65  COMPUTES FREQ SHIFT.
37 *           φ 15625 CORRECTS FREQ SHIFT FOR
41 :           φ  1φφφ SELECTED FREQ RESOLUTION.
45 MS    31   292
49 MS    21    φ       STORES RESULTS ON DISC.
56                     END.
```

RESULTS:
FREQ SHIFT RESULTS ARE STORED ON RECORD 292 OF DISC.

SUBROUTINE Y1822 FOR FREQUENCY SHIFT PROGRAM

PROGRAM DESCRIPTION:
THIS ROUTINE GETS THE MAGNITUDE VALUES IN THE CARRIER FREQUENCY CHANNEL AND IN EACH ADJACENT CHANNEL TO THE CARRIER, OF BLOCK J, AND COMPUTES THE FREQUENCY SHIFT. THE RESULT IS PUT INTO CHANNEL φ OF BLOCK J.

```
φφφ1    FTN,B,L
φφφ2            SUBROUTINE Y1822(IP,JBUF)
φφφ3            DIMENSION JBUF(2),AMPL(3)
φφφ4            J = JBUF(1)
φφφ5            K = JBUF(2) − 1
φφφ6            L = K + 2
φφφ7            KCL = φ41514B
φφφ8            N1 = 1
φφφ9            N2 = 256
φφ1φ            I = φ
φφ11            DO 1φφ ICH = K,L
φφ12            I = I + 1
φφ13            CALL GET(J,ICH,AMPL(I),DMY)
φφ14    1φφ     CONTINUE
φφ15            IF(AMPL(3) − AMPL(1))3φφ,2φφ,2φφ
φφ16    2φφ     DELF = (2.*AMPL(3) − AMPL(2))/(AMPL(2) − AMPL(3))
φφ17            GO TO 4φφ
φφ18    3φφ     DELF = −(2.*AMPL(1) − AMPL(2))/(AMPL(2) + AMPL(1))
φφ19    4φφ     CALL KYBD(KCL,J,N1,N2)
φφ2φ            CALL PUT(J,φ,DELF,DMY)
φφ21            RETURN
φφ22            END
```

FREQ RESPONSE & ENVELOPE DELAY DISTORTION (TEST 1)

APPENDIX-continued

LOAD FOLLOWING DATA:
  21-TONE SIGNAL INTO BLOCK 5 FROM RECORD 259 OF DISC.
  21-TONE COMB FILTER INTO BLOCK 6 FROM RECORD 256 OF DISC.
  BACK TO BACK FREQ RESPONSE INTO BLOCK 7 FROM RECORD 26ϕ
    OF DISC.
  BACK TO BACK DELAY DISTORTION INTO BLOCK 8 FROM
    RECORD 261 OF DISC.
POSITION DISC TO:
  FIRST TEST 1 DATA RECORD FROM TEST UNIT 103.
PROGRAM:

| Line | Op | A | B | C | Comment |
|---|---|---|---|---|---|
| 1 | L | ϕ | | | |
| 4 | CL | 2 | | | |
| 7 | CL | 3 | | | |
| 1ϕ | L | 1 | | | |
| 13 | MS | 11 | ϕ | | LOADS NEXT DATA RECORD INTO BLOCK ϕ. |
| 17 | H1 | | | | HANNS BLOCK ϕ. |
| 19 | F | | | | FOURIER TRANSFORMS. |
| 21 | X> | 1 | | | |
| 24 | CL | 1 | ϕ | 122 | MULTIPLIES EACH |
| 29 | CL | 1 | 124 | 256 | TONE BY COMPLEX |
| 34 | ← | 1 | 122 | | CONJUGATE OF |
| 38 | $ | 1 | | | VALUE IN CHANNEL |
| 41 | *— | 1 | | | 123 (1922 HZ). |
| 44 | * | 6 | | | FILTERS OUT EVERYTHING EXCEPT 21 TONES. |
| 47 | X> | 1 | | | |
| 5ϕ | *— | | | | COMPUTES POWER SPECTRUM |
| 52 | A+ | 2 | | | FOR FREQ RESPONSE. |
| 55 | X> | 2 | | | |
| 58 | X< | 1 | | | REMOVES PHASE DIFFERENCES DUE |
| 61 | : | 5 | | | TO PHASE VALUES OF TRANSMITTED SIGNAL. |
| 64 | X> | 1 | | | |
| 67 | ← | 1 | 1ϕ | | COMPUTES PHASE DIFFERENCE |
| 71 | : | 1 | | | OF ADJACENT TONES. |
| 74 | X> | 1 | | | |
| 77 | ← | ϕ | 112 | | PHASE DIFFERENCE |
| 81 | CL | ϕ | 2 | 256 | VALUES ARE |
| 86 | $ | | | | REFERENCED |
| 88 | * | 6 | | | TO VALUE |
| 91 | X | 1 | | | AT |
| 94 | : | 1 | | | 1844 HZ. |
| 97 | TP | | | | CONVERTS FROM RECT TO POLAR COORDINATES. |
| 99 | Y | 1879 | ϕ | | COMPUTES ENVELOPE DELAY DISTORTION. |
| 1ϕ3 | ← | ϕ | 251 | | PUTS DELAY VALUES IN PROPER CHANNELS. |
| 1ϕ7 | TR | | | | |
| 1ϕ9 | A+ | 3 | | | |
| 112 | X> | 3 | | | |
| 115 | # | 1 | N | | REPEATS LINES 1ϕ THRU 112 |
| 119 | : | 2 | N | | N TIMES AND AVERAGES, N = 6. |
| 123 | : | 3 | N | | |
| 127 | L | 2 | | | |
| 130 | < | 2 | | | |
| 133 | : | 7 | | | REMOVES BACK TO BACK FREQ |
| 136 | X> | 1 | | | RESPONSE OF TEST UNIT. |
| 139 | ← | 1 | 63 | | REFERENCES FREQ |
| 143 | CL | 1 | 1 | 256 | RESPONSE VALUES |
| 148 | $ | 1 | | | TO VALUE IN CHNL |
| 151 | : | 1 | | | 63 (984 HZ). |
| 154 | X> | 2 | | | |
| 157 | X< | 3 | | | |
| 160 | A− | 8 | | | REMOVES BACK TO BACK DELAY RESPONSE OF TEST UNIT. |
| 163 | MS | 31 | 275 | | |
| 167 | MS | 21 | 2 | | STORES FREQ RESPONSE & DELAY |
| 171 | MS | 21 | ϕ | | DIST RESULTS ON DISC. |
| 175 | . | | | | END. |

RESULTS:
  FREQ RESPONSE RESULTS ARE STORED ON RECORD 275 OF DISC.
  DELAY DISTORTION RESULTS ARE STORED ON RECORD 276
    OF DISC.

FREQ RESPONSE & ENVELOPE DELAY DISTORTION (TEST 2)

LOAD FOLLOWING DATA:
  21-TONE SIGNAL INTO BLOCK 5 FROM RECORD 259 of DISC.

APPENDIX-continued

21-TONE COMB FILTER INTO BLOCK 6 FROM RECORD 256 OF DISC.
BACK TO BACK FREQ RESPONSE INTO BLOCK 7 FROM RECORD 26φ
  OF DISC.
BACK TO BACK DELAY DISTORTION INTO BLOCK 8 FROM
  RECORD 261 OF DISC.
POSITION DISC TO:
  FIRST TEST 2 DATA RECORD FROM TEST UNIT 103.
PROGRAM:

| | | | | | |
|---|---|---|---|---|---|
| 1 | L | φ | | | |
| 4 | CL | 2 | | | |
| 7 | CL | 3 | | | |
| 1φ | L | 1 | | | |
| 13 | MS | 11 | φ | | LOADS NEXT TEST 2 DATA RECORD INTO BLOCK φ. |
| 17 | H1 | | | | HANNS BLOCK φ |
| 19 | F | | | | FOURIER TRANSFORMS |
| 21 | X> | 1 | | | |
| 24 | CL | 1 | φ | 122 | MULTIPLIES EACH |
| 29 | CL | 1 | 124 | 256 | TONE BY COMPLEX |
| 34 | ← | 1 | 122 | | CONJUGATE OF |
| 38 | $ | 1 | | | VALUE IN CHANNEL |
| 41 | *— | 1 | | | 123 (1922 HZ). |
| 44 | * | 6 | | | FILTERS OUT EVERYTHING EXCEPT 21 TONES. |
| 47 | X> | 1 | | | |
| 5φ | *— | | | | COMPUTES POWER SPECTRUM |
| 52 | A+ | 2 | | | FOR FREQ RESPONSE. |
| 55 | X> | 2 | | | |
| 58 | X< | 1 | | | REMOVES PHASE DIFFERENCES DUE |
| 61 | : | 5 | | | TO PHASE VALUES OF TRANSMITTED SIGNAL. |
| 64 | X> | 1 | | | |
| 67 | ← | 1 | 1φ | | COMPUTES PHASE DIFFERENCE |
| 71 | : | 1 | | | OF ADJACENT TONES. |
| 74 | X> | 1 | | | |
| 77 | ← | φ | 112 | | PHASE DIFFERENCE |
| 81 | CL | φ | 2 | 256 | VALUES ARE |
| 86 | $ | | | | REFERENCED |
| 85 | * | 6 | | | TO VALUE |
| 91 | X | 1 | | | AT |
| 94 | : | 1 | | | 1844 HZ. |
| 97 | TP | | | | CONVERTS FROM RECT TO POLAR COORDINATES. |
| 99 | Y | 1879 | φ | | COMPUTES ENVELOPE DELAY DISTORTION. |
| 103 | ← | φ | 251 | | PUTS DELAY VALUES IN PROPER CHANNELS. |
| 1φ7 | TR | | | | |
| 1φ9 | A+ | 3 | | | |
| 112 | X> | 3 | | | |
| 115 | # | 1 | N | | REPEATS LINES 1φ THRU 112 |
| 119 | : | 2 | N | | |
| 123 | : | 3 | N | | |
| 127 | L | 2 | | | N TIMES AND AVERAGES, N = 21. |
| 130 | X< | 2 | | | |
| 133 | : | 7 | | | REMOVES BACK TO BACK FREQ |
| 136 | X> | 1 | | | RESPONSE OF TEST UNIT. |
| 139 | ← | 1 | 63 | | REFERENCES FREQ |
| 143 | CL | 1 | 1 | 256 | RESPONSE VALUES |
| 148 | $ | 1 | | | TO VALUE IN CHNL |
| 151 | : | 1 | | | 63 (984 HZ). |
| 154 | X> | 2 | | | |
| 157 | X< | 3 | | | |
| 160 | A− | 8 | | | REMOVES BACK TO BACK DELAY RESPONSE OF TEST UNIT. |
| 163 | MS | 31 | 295 | | |
| 167 | MS | 21 | 2 | | STORES FREQ RESPONSE & DELAY |
| 171 | MS | 21 | φ | | DIST RESULTS ON DISC. |
| 175 | . | | | | END. |

RESULTS:
  FREQ RESPONSE RESULTS ARE STORED ON RECORD 295 OF DISC.
  DELAY DISTORTION RESULTS ARE STORED ON RECORD 296
    OF DISC.

FREQ RESPONSE & ENVELOPE DELAY DISTORTION (TEST 3)

LOAD FOLLOWING DATA:
  21-TONE SIGNAL INTO BLOCK 5 FROM RECORD 255 OF DISC.
  21-TONE COMB FLTR INTO BLOCK 6 FROM RECORD 256 OF DISC.
  BACK TO BACK FREQ RESPONSE INTO BLOCK 7 FROM RECORD 257
    OF DISC.

APPENDIX-continued

BACK TO BACK DELAY DISTORTION INTO BLOCK 8 FROM RECORD 258 OF DISC.
POSITION DISC TO:
FIRST TEST 3 DATA RECORD FROM TEST UNIT 103.
PROGRAM:

| Line | Op | A | B | C | Comment |
|---|---|---|---|---|---|
| 1 | L | φ | | | |
| 4 | CL | 2 | | | |
| 7 | CL | 3 | | | |
| 10 | L | 1 | | | |
| 13 | MS | 11 | φ | | LOADS NEXT TEST 3 DATA RECORD INTO BLOCK φ. |
| 17 | H1 | | | | HANNS BLOCK φ. |
| 19 | F | | | | FOURIER TRANSFORMS. |
| 21 | X> | 1 | | | |
| 24 | CL | 1 | φ | 122 | MULTIPLIES EACH |
| 29 | CL | 1 | 124 | 256 | TONE BY COMPLEX |
| 34 | ← | 1 | 122 | | CONJUGATE OF |
| 38 | $ | 1 | | | VALUE IN CHNL |
| 41 | *— | 1 | | | 123 (1922 HZ). |
| 44 | * | 6 | | | FILTERS OUT EVERYTHING EXCEPT 21 TONES. |
| 47 | X> | 1 | | | |
| 50 | *— | | | | COMPUTES POWER SPECTRUM |
| 52 | A+ | 2 | | | FOR FREQ RESPONSE. |
| 55 | X> | 2 | | | |
| 58 | X< | 5 | | | |
| 61 | CL | 5 | φ | 13 | REMOVES |
| 66 | ← | 5 | 10 | | PHASE |
| 70 | CL | φ | 14 | 256 | DIFFERENCES |
| 75 | ← | φ | 56 | | DUE |
| 79 | A+ | 5 | | | TO |
| 82 | X> | 5 | | | PHASE |
| 85 | F | | | | VALUES |
| 87 | H1 | | | | OF |
| 89 | F | | | | THE |
| 91 | X> | 4 | | | TRANSMITTED |
| 94 | X< | 1 | | | SIGNAL. |
| 97 | : | 4 | | | |
| 100 | X> | 1 | | | |
| 103 | ← | 1 | 10 | | COMPUTES PHASE DIFFERENCE |
| 107 | : | 1 | | | VALUES OF ADJACENT TONES. |
| 110 | X> | 1 | | | |
| 113 | ← | φ | 112 | | PHASE DIFFERENCE |
| 117 | CL | φ | 2 | 256 | VALUES ARE |
| 122 | $ | | | | REFERENCED |
| 124 | * | 6 | | | TO VALUE |
| 127 | X | 1 | | | AT |
| 130 | : | 1 | | | 1844 HZ. |
| 133 | TP | | | | CONVERTS FROM RECT TO POLAR COORDINATES. |
| 135 | Y | 1879 | φ | | COMPUTES ENVELOPE DELAY DISTORTION. |
| 139 | ← | φ | 251 | | PUTS DELAY VALUES IN PROPER CHANNELS. |
| 143 | TR | | | | |
| 145 | A+ | 3 | | | |
| 148 | X> | 3 | | | |
| 151 | # | 1 | N | | REPEATS LINES 10 THRU 148 N TIMES AND AVERAGES, N = 21. |
| 155 | : | 2 | N | | |
| 159 | : | 3 | N | | |
| 163 | L | 2 | | | |
| 166 | X< | 2 | | | |
| 169 | : | 7 | | | REMOVES BACK TO BACK FREQ RESPONSE OF TEST UNIT. |
| 172 | X> | 1 | | | |
| 175 | ← | 1 | 63 | | REFERENCES FREQ |
| 179 | CL | 1 | 1 | 256 | RESPONSE VALUES |
| 184 | $ | 1 | | | TO VALUE IN CHNL |
| 187 | : | 1 | | | 63 (984 HZ). |
| 190 | X> | 2 | | | |
| 193 | X< | 3 | | | |
| 196 | A− | 8 | | | REMOVES BACK TO BACK DELAY OF TEST UNIT. |
| 199 | MS | 31 | 297 | | |
| 203 | MS | 21 | 2 | | STORES FREQ RESPONSE |
| 207 | MS | 21 | φ | | & DELAY RESULTS ON DISC. |
| 211 | . | | | | END. |

RESULTS:
FREQ RESPONSE RESULTS ARE STORED ON RECORD 297 OF DISC.
DELAY DISTORTION RESULTS ARE STORED ON RECORD 298

APPENDIX-continued

OF DISC.

SUBROUTINE Y1879 FOR FREQ RESPONSE & ENVELOPE DELAY DISTORTION PROGRAMS

PROGRAM DESCRIPTION:
  THIS PROGRAM GETS 2φ PHASE DIFFERENCE VALUES IN BLOCK L,
  CHNLS 13 TO 2φ3, EVERY 1φ CHNLS, AND COMPUTES THE
  ENVELOPE DELAY DISTORTION (EDD). THE PROGRAM CORRECTS
  FOR TRANSITIONS WHICH RESULT FROM THE FOURIER ANALYZER
  NORMALIZING THE PHASE DIFFERENCE VALUES TO THE
  RANGE −18φ TO +18φ DEGREES. THE CORRECTIONS ARE VALID
  ONLY IF THE EDD DIFFERENCE BETWEEN ADJACENT FREQUENCIES
  IS LESS THAN 32φφ MICROSECONDS. THE EDD
  VALUES ARE THEN PUT BACK IN THE SAME BLOCK WHERE THE
  PHASE DIFFERENCE VALUES WERE (BLOCK L).

```
φφφ1   FTN,B,L
φφφ2          SUBROUTINE Y1879(IP,JBUF)
φφφ3          DIMENSION JBUF(1),EDD(2φ)
φφφ4          DIMENSION NQUAL(5),MQUAL(5)
φφφ5          I = JBUF(1)
φφφ6          A = 8φφφ.*1φ.*36φ./512.
φφφ7          K = 1
φφφ8          DO 1φφ ICHNL = 13,2φ3,1φ
φφφ9          CALL GET(L,ICHNL,DR,DI)
φφ1φ          EDD(K) = DI/A
φφ11          K = K + 1
φφ12   1φφ    CONTINUE
φφ13          DO 35φ I = 1, 1φ
φφ14          J = 12 − I
φφ15          DIF = EDD(J) − EDD(J − 1)
φφ16          IF(DIF − 32φφ.*1.E − 6)15φ,15φ,2φφ
φφ17   15φ    IF(DIF + 32φφ.*1.E − 6)25φ,3φφ,3φφ
φφ18   2φφ    EDD(J − 1) = EDD(J − 1) + 64φφ.*1.E − 6
φφ19          GO TO 3φφ
φφ2φ   25φ    EDD(J − 1) = EDD(J − 1) − 64φφ.*1.E − 6
φφ21   3φφ    CONTINUE
φφ22   35φ    CONTINUE
φφ23          DO 6φφ I = 1,9
φφ24          J = 1φ + I
φφ25          DIF = EDD(J) − EDD(J − 1)
φφ26          IF(DIF − 32φφ.*1.E − 6)4φφ,4φφ,45φ
φφ27   4φφ    IF(DIF + 32φφ.*1.E − 6)5φφ,55φ,55φ
φφ28   45φ    EDD(J + 1) = EDD(J + 1) + 64φφ.*1.E − 6
φφ29          GO TO 55φ
φφ3φ   5φφ    EDD(J + 1) = EDD(J + 1) − 64φφ.*1.E − 6
φφ31   55φ    CONTINUE
φφ32   6φφ    CONTINUE
φφ33          CALL GFTQ(L,NQUAL)
φφ34          MQUAL(1) = NQUAL(1)
φφ35          MQUAL(2) = 177615B
φφ36          MQUAL(3) = 32767B
φφ37          MQUAL(4) = NQUAL(4)
φφ38          MQUAL(5) = NQUAL(5)
φφ39          CALL PUTQ(L,MQUAL)
φφ4φ          K = 1
φφ41          DO 65φ ICHNL = 13,2φ3,1φ
φφ42          DI = φ
φφ43          CALL PUT(L,ICHNL,EDD(K),DI)
φφ44          K = K + 1
φφ45   65φ    CONTINUE
φφ46          RETURN
φφ47          END
```

We claim:

1. Apparatus (FIG. 1) for obtaining a measure of at least one prescribed transmission characteristic of a network or facility (105) of the type including the generation and transmission of a test signal having a plurality of tones over the network or facility and utilizing characteristics of a received version of the transmitted test signal to generate the measure of the at least one prescribed transmission characteristic, wherein the improvement comprises, means for generating the test signal having the plurality of tones, each tone having a predetermined frequency and a different phase component value determined in accordance with prescribed criteria.

2. Apparatus as defined in claim 1 wherein said prescribed criteria include assigning said phase component values initially on a random, one-to-one basis to said plurality of tones.

3. Apparatus as defined in claim 1 wherein said prescribed criteria include obtaining said phase component values in accordance with a predetermined relationship dependent on the number of tones in said test signal.

4. Apparatus as defined in claim 3 wherein said predetermined relationship for determining said phase component values is $$\phi n = 360(n)/N \text{ degrees}$$

where $\phi n$ is the phase component value, N is the number of tones in the test signal, and n is the phase component.

5. Apparatus adapted for use in measuring at least one prescribed transmission characteristic of a network or facility of the type including
   means for generating a test signal having a plurality of tones,
   means for transmitting the test signal over the network or facility,
   means for receiving a test signal transmitted over the network or facility, and
   means for utilizing a received version of the test signal for generating a measure of the at least one prescribed transmission characteristic, wherein the improvement comprises.
   each of said tones being generated having a predetermined frequency and a different phase component value determined in accordance with prescribed criteria.

6. Apparatus as defined in claim 5, wherein said transmitting means includes
   means for transmitting said test signal over the network or facility a predetermined number of times, and wherein said generating means includes
   means for assigning said phase component values initially on a random, one-to-one basis to said plurality of tones, and
   means for reassigning said phase component values on a one-to-one basis to said tones after each transmission of said test signal in accordance with a prescribed criterion.

7. Apparatus as defined in claim 5 wherein said receiving means includes
   means for making a predetermined number of sets of measurements of the received test signal and
   means for averaging the measurements in each individual set of said sets of measurements, and wherein said utilizing means includes
   means for generating an ensemble of said averaged individual sets of measurements and
   means supplied with said ensemble for generating a measurement value of the at least one prescribed transmission characteristic.

8. Apparatus as defined in claim 7 wherein said ensemble is used to generate a measure of envelope delay distortion of the network or facility.

9. Apparatus as defined in claim 7 wherein said ensemble is used to generate a measure of frequency response of the network or facility.

10. Apparatus as defined in claim 6 wherein said phase component value reassignment criterion includes reassigning said phase component values to said tones in counterclockwise, circular fashion upon each subsequent transmission of said test signal.

11. Apparatus as defined in claim 10 wherein said test signal is transmitted a predetermined number of times determined in relationship to the number of tones in said test signal.

12. Apparatus as defined in claim 7 wherein each of said sets of measurements includes a predetermined number of consecutive measurements and said ensemble includes a predetermined number of said averaged sets of measurements.

13. Apparatus as defined in claim 12 wherein said means for utilizing further includes
   means supplied with said ensemble for generating a spectrum of frequency components for each of said averaged sets of measurements in said ensemble, and
   means supplied with said frequency components of each of said spectrums for generating measurement values of the at least one prescribed characteristic.

14. Apparatus as defined in claim 13 wherein said means for utilizing further includes
   means for generating phase difference values of adjacent predetermined ones of said frequency components in said spectrums, and
   means supplied with said phase difference values for generating a measurement value of envelope delay distortion of the facility or network.

15. Apparatus as defined in claim 7, wherein said transmitting means includes
   means for transmitting a set of said test signals, and wherein said generating means includes
   means for assigning phase component values to each tone in said test signal initially on a random, one-to-one basis and
   means responsive to each transmission of each test signal in said set for reassigning said phase component values on a one-to-one basis to the tones in said test signal in accordance with a prescribed criterion upon each transmission of a test signal in said set.

16. Apparatus as defined in claim 15 wherein said phase component values are reassigned to said tones in a counterclockwise, circular fashion after each transmission of a test signal in said set.

17. Apparatus as defined in claim 16, wherein said receiving means includes
   means for taking sets of measurements for each received signal corresponding to said test signals in said set of test signals and
   means for averaging the measurements in each set of said sets of measurements, and wherein said utilizing means includes
   means for generating an ensemble of said averaged sets of measurements and
   means supplied with said ensemble for generating a measurement value of said at least one prescribed characteristic.

18. Apparatus as defined in claim 17 wherein said phase component values are reassigned a plurality of times determined in accordance with the number of tones in said test signal and wherein said set of test signals includes a number of test signals equal to said number of tones.

19. Apparatus as defined in claim 18 wherein said ensemble is utilized to generate a measurement value of envelope delay distortion of the facility or network.

20. Apparatus as defined in claim 18 wherein said ensemble is utilized to generate a measurement value of frequency response of the facility or network.

21. Apparatus (FIG. 1) for obtaining a measure of at least one prescribed transmission characteristic of a network, or facility (105) of the type including,
   means for generating a test signal having a plurality of tones,
   means for transmitting the test signal over the network or facility,
   means for receiving a test signal transmitted over the network or facility, and
   means for utilizing a received version of the test signal for generating a measure of the at least one prescribed transmission characteristic, wherein the improvement comprises, said generating means including means for generating a set of test signals, each test signal having a plurality of tones and each tone having predetermined amplitude, frequency and phase component values determined in accordance with prescribed criteria, said set including at least one of said test signals, said receiving means including means for making a set of measurements of each received version of said test signals in said set of test signals, thereby generating a number of sets of measurements corresponding to the number of test signals in said set of test signals.

means for time averaging the measurements in each individual set of said sets of measurements, and said utilizing means includes means for generating an ensemble of successively obtained ones of said time averaged sets of said measurements and means supplied with said ensemble for generating the measure of the at least one prescribed transmission characteristic 22. Apparatus as defined in claim 21 wherein said set of measurements includes a predetermined number of consecutive measurements of said test signal, and said ensemble includes a predetermined number of said time averaged sets of measurements.

23. Apparatus as defined in claim 22 wherein said phase component values are determined in relationship to the number of tones in said test signal and assigned on a one-to-one basis to said tones in accordance with a predetermined selection procedure.

24. Apparatus as defined in claim 23 wherein said selection procedure includes initial random selection.

25. Apparatus as defined in claim 24 wherein said set of test signals includes a plurality of test signals and said phase component values are assigned to the tones in said plurality of test after initial random selection in accordance with a predetermined criterion.

26. A method for generating a measurement of at least one prescribed transmission characteristic of a network or facility under evaluation comprising the steps of, generating a set of test signals, each test signal having a plurality of tones, and each tone having a predetermined amplitude, frequency and phase component values determined in accordance with a prescribed criterion, said set of test signals including at least one of said test signals, transmitting said set of test signals over said network or facility under evaluation, making a set of consecutive measurements of a received version of each test signal in said set thereby obtaining a number of sets of measurements corresponding to the number of test signals in said set of test signals, time averaging the measurements in each individual set of said sets of measurements, obtaining an ensemble of successively obtained time averaged sets of measurements, and utilizing said ensemble to generate the measure of the at least one prescribed transmission characteristic 27. The method of claim 26 wherein said set of test signals includes a plurality of said test signals, said transmitting step includes successively transmitting individual ones of said test signals, and said generating step includes reassigning said phase component values to said tones after each transmission of one of said test signals in accordance with a predetermined criterion.

28. The method of claim 27 wherein said assignment criteria include initially assigning said phase component values on a random one-to-one basis and said predetermined reassignment criteria include reassigning said phase component values to said tones in counterclockwise, circular fashion.

29. The method of claim 28 wherein said test signal is transmitted a number of times equal to the number of tones in said test signal.

30. The method of claim 29 wherein said utilizing step includes obtaining a spectrum of each time averaged set of measurements in said ensemble, and employing frequency components in said spectrums to obtain the measurement of envelope delay distortion and/or frequency response.

31. A method as defined in claim 26 wherein said phase component assignment criteria include initially assigning said phase component values to said tones on a random, one-to-one basis, said set of measurements includes a predetermined number of consecutive measurements, said ensemble includes a predetermined number of time averaged sets of measurements, and said utilizing step includes obtaining a spectrum of frequency components of each time averaged set of measurements in said ensemble and employing said frequency components in said spectrums to obtain the measurement of the at least one prescribed transmission characteristic.

32. The method of claim 26 further including the steps of first obtaining measurements of predetermined characteristics of said facility under evaluation, and then selecting one of a plurality of test procedures depending upon said measurements of said predetermined characteristics being within predetermined limits, a first test procedure being used when said measurements of said predetermined characteristics are within first predetermined limits including said set of test signals including one test signal, transmitting said test signal continuously during a prescribed interval, and wherein said set of measurements of said received version of the test signal includes a predetermined number of measurements greater in number than the number of time averaged sets of measurements in said ensemble, a second test procedure being used when said measurements of said predetermined characteristics are within second predetermined limits including said set of test signals including one test signal, transmitting said test signal continuously during a prescribed interval, and wherein said set of measurements of said received version of said test signal includes a predetermined number of measurements less in number than the number of time averaged sets of measurements in said ensemble, and a third test procedure being used when said measurements of said predetermined characteristics are within third predetermined limits including said set of test signals including a plurality of said test signals, said transmitting step includes successively transmitting individual ones of said test signals and said generating step includes reassigning said phase component values to said tones after each transmission of one of said test signals in a predetermined manner.

* * * * *